(12) United States Patent
Akselrod et al.

(10) Patent No.: US 7,190,649 B2
(45) Date of Patent: Mar. 13, 2007

(54) BIT-WISE OPTICAL DATA STORAGE UTILIZING ALUMINUM OXIDE SINGLE CRYSTAL MEDIUM

(75) Inventors: Mark S. Akselrod, Stillwater, OK (US); Sergei S. Orlov, Mountain View, CA (US); Anna E. Akselrod, Stillwater, OK (US)

(73) Assignee: Landauer, Inc., Glenwood, IL (US)

( * ) Notice: Subject to any disclaimer, the term of this patent is extended or adjusted under 35 U.S.C. 154(b) by 587 days.

(21) Appl. No.: 10/633,654

(22) Filed: Aug. 5, 2003

(65) Prior Publication Data

US 2005/0078591 A1 Apr. 14, 2005

Related U.S. Application Data

(63) Continuation-in-part of application No. 10/309,021, filed on Dec. 4, 2002, now Pat. No. 6,846,434, and a continuation-in-part of application No. 10/309,179, filed on Dec. 4, 2002, now Pat. No. 6,811,607, and a continuation-in-part of application No. 10/419,726, filed on Apr. 22, 2003.

(60) Provisional application No. 60/417,153, filed on Oct. 10, 2002, provisional application No. 60/336,749, filed on Dec. 4, 2001.

(51) Int. Cl.
*G11B 7/00* (2006.01)

(52) U.S. Cl. .............. 369/53.1; 369/275.1; 369/47.1; 369/100

(58) Field of Classification Search .................. None
See application file for complete search history.

(56) References Cited

U.S. PATENT DOCUMENTS

| 4,313,188 | A | * | 1/1982 | Bartolini et al. ............ 369/100 |
| 5,206,514 | A | * | 4/1993 | Brandner et al. ........ 250/484.4 |
| 6,630,349 | B1 | * | 10/2003 | Rossant et al. ............. 435/325 |

OTHER PUBLICATIONS

International Search Report, International Application No.: PCT/US2003/31730, dated May 4, 2006.

* cited by examiner

*Primary Examiner*—Muhammad Edun
(74) *Attorney, Agent, or Firm*—Jagtiani + Guttag

(57) ABSTRACT

The present invention provides methods and apparatuses for writing information to, reading information from, and erasing information on a luminescent data storage medium comprising $Al_2O_3$. The method includes writing and erasing of the information using photoionization via sequential two-photon absorption and non-destructive reading the information using one-photon absorption and confocal fluorescent detection. The apparatuses for writing and reading the information incorporate confocal detection and spherical aberration correction for multilayer volumetric fluorescent data storage. The methods also allow multilevel recording and readout of information for increased storage capacity.

41 Claims, 24 Drawing Sheets

BIT-WISE OPTICAL DATA STORAGE UTILIZING ALUMINUM OXIDE SINGLE CRYSTAL MEDIUM

CROSS-REFERENCE TO RELATED APPLICATIONS

This application is a continuation-in-part of U.S. App. Ser. No. 10/309,021, filed Dec. 4, 2002, now U.S. Pat. No. 6,846,434, entitled, "Aluminum Oxide Material for Optical Data Storage," which claims the priority of U.S. Provisional App. No. 60/336,749, filed Dec. 4, 2001, now abandoned, and U.S. App. Ser. No. 10/309,179, filed Dec. 4, 2002, now U.S. Pat. No. 6,811,607, entitled, "Method for Forming Aluminum Oxide Material Used in Optical Data Storage," which claims the priority of U.S. Provisional App. No. 60/417,153, filed Oct. 10, 2002 and U.S. App. No. 10/419,726 filed Apr. 22, 2003, entitled "Confocal One-Bit Recording and Fluorescent Readout Utilizing Aluminum Oxide Single Crystals." The entire disclosures and contents of the above applications are hereby incorporated by reference.

BACKGROUND OF THE INVENTION

1. Field of the Invention

The present invention relates to methods of writing to, reading from and erasing information on a data storage medium.

2. Description of the Prior Art

Various attempts have been made to design higher density data storage media for computer devices to replace conventional storage media such as magnetic disks, CD-ROMs, DVDs, etc. Many of the obstacles faced with respect to developing improved data storage methods have been associated with inadequate storage material properties. For example, photopolymers have been investigated for use in one-bit or holographic data storage. However, photopolymers exhibit strong dimensional shrinkage. Also, most photo-sensitive polymers may be used only as WORM media (write once, read many times) and the rewritable photopolymers are still unstable and show significant fatigue when write-read cycles are repeated many times. Even write-once fluorescent photopolymers show strong reduction of fluorescent output signals when read repeatedly. An additional problem with most photopolymers, as well as for photorefractive crystals, another potential material for volumetric one-bit recording, is the necessity of using a femtosecond high peak power Ti-sapphire laser to achieve efficient two-photon absorption. This type of laser is big, expensive and suitable only for laboratory demonstration.

Therefore, there exists a need for better materials for making high density data storage devices.

SUMMARY OF THE INVENTION

It is therefore an object of the present invention to provide a data storage method utilizing an aluminum oxide material that allows for fast electronic processing in comparison with phase change transition or photo-induced polymerization techniques for data storage.

It is a further object of the present invention to provide a data storage method utilizing an aluminum oxide material that is capable of achieving a write/read rate up to 100 Mbit per second.

It is yet another object of the present invention to provide a data storage method utilizing an aluminum oxide material that provides the ability to perform parallel processing of multiple marks on a data storage medium for an increase of write/read rate.

It is yet another object of the present invention to provide a data storage method utilizing an aluminum oxide material that provides high data storage density restricted only by diffraction limit and NA of the optical components.

It is yet another object of the present invention to provide a data storage method utilizing aluminum oxide material that provides the possibility of multilevel data storage due to dependency of fluorescence response from writing laser energy.

It is yet another object of the present invention to provide a data storage method utilizing aluminum oxide material that only requires low laser light energies for writing and reading of information (pJ and nJ range).

It is yet another object of the present invention to provide a data storage method utilizing aluminum oxide material that provides extremely high temperature and time stability of stored data.

It is yet another object of the present invention to provide a data storage method utilizing aluminum oxide material that provides no degradation of material performance after millions of write/read cycles.

According to a first broad aspect of the present invention, there is provided a method of reading information stored on a data storage medium comprising the steps of: (a) exciting a luminescent data storage medium with an optical source to thereby cause the luminescent data storage medium to emit a fluorescent light signal, wherein the luminescent data storage medium comprises $Al_2O_3$ and wherein the optical source emits a read laser beam having a wavelength in the range of an absorption band of the luminescent data storage medium; and (b) measuring the laser induced fluorescence light signal from the luminescent data storage medium, to thereby read the information stored on the luminescent data storage medium, wherein the luminescent data storage medium comprises: a base material comprising $Al_2O_3$; a first dopant comprising magnesium; and a second dopant comprising carbon, wherein the luminescent data storage medium includes a plurality of at least one type of oxygen vacancy defect, and wherein the luminescent data storage medium includes at least one color center having: an absorption bands in the regions of $250\pm5$ nm, $335\pm5$ nm and $620\pm10$ nm, an emission in the region of $750\pm10$ nm, and a $80\pm10$ ns lifetime.

According to a second broad aspect of the present invention, there is provided a method of writing information to a data storage medium comprising the steps of: providing a luminescent data storage medium comprising $Al_2O_3$; and writing the information to the luminescent data storage medium with an optical source, wherein the luminescent data storage medium has an orientation of the optical c-axis parallel to the direction of the light propagation of the optical source.

According to a third broad aspect of the present invention, there is provided a method of writing information to a data storage medium comprising the steps of: providing a luminescent data storage medium comprising $Al_2O_3$; and writing the information to the luminescent data storage medium with an optical source, wherein the luminescent data storage medium has an orientation of the optical c-axis perpendicular to the direction of the light propagation of the optical source and wherein the vector of polarization of the optical source rotates synchronously with the rotation of the luminescent data storage medium, and maintains the optical c-axis of the crystal parallel to the polarization direction of the optical source.

According to a fourth broad aspect of the present invention, there is provided a method of reading information stored on a data storage medium comprising the steps of: (a) exciting a luminescent data storage medium with an optical source to thereby cause the luminescent data storage medium to emit a fluorescent light signal, wherein the luminescent data storage medium comprises $Al_2O_3$ and wherein the optical source emits a read laser beam having a wavelength in the range of an absorption band of the luminescent data storage medium; and wherein the luminescent data storage medium has an orientation of the optical c-axis parallel to the direction of the light propagation of the optical source; and (b) measuring the laser induced fluorescence light signal from the luminescent data storage medium, to thereby read the information stored on the luminescent data storage medium.

According to a fifth broad aspect of the present invention, there is provided a method of reading information stored on a data storage medium comprising the steps of: (a) exciting a luminescent data storage medium with an optical source to thereby cause the luminescent data storage medium to emit a fluorescent light signal, wherein the luminescent data storage medium comprises $Al_2O_3$ and wherein the optical source emits a read laser beam having a wavelength in the range of an absorption band of the luminescent data storage medium; and wherein the luminescent data storage medium has an orientation of the optical c-axis perpendicular to the direction of the light propagation of the optical source and wherein the vector of polarization of the optical source rotates synchronously with the rotation of the luminescent data storage medium, and wherein the c-axis of the crystal maintains parallel to the polarization direction of the optical source; and (b) measuring the laser induced fluorescence light signal from the luminescent data storage medium, to thereby read the information stored on the luminescent data storage medium.

According to a sixth broad aspect of the present invention, there is provided a method of erasing information stored on a data storage medium comprising the steps of: (a) providing a luminescent data storage medium comprising $Al_2O_3$, the luminescent data storage medium having the information stored thereon; and (b) illuminating the luminescent data storage medium with an optical source to thereby erase the information, wherein the luminescent data storage medium comprises: a base material comprising $Al_2O_3$; a first dopant comprising magnesium; and a second dopant comprising carbon, wherein the luminescent data storage medium includes a plurality of at least one type of oxygen vacancy defect, and wherein the luminescent data storage medium includes at least one color center having: an absorption bands in the region of 250±5 nm, 335±5 nm and 620±10 nm, an emission in the region of 750±5 nm and a 80±10 ns lifetime.

According to an seventh broad aspect of the present invention, there is provided an apparatus comprising: a luminescent data storage medium comprising $Al_2O_3$; an optical source for writing information to the luminescent data storage medium; and a means for rotating the luminescent data storage medium and means for rotating of the vector of polarization of the optical source, wherein an optical c-axis of the luminescent data storage medium rotates synchronously and is parallel to the vector of polarization of the optical source.

According to a eighth broad aspect of the present invention, there is provided an apparatus comprising: a luminescent data storage medium comprising $Al_2O_3$; a first optical source for exciting the luminescent data storage medium to thereby cause the luminescent data storage medium to emit a fluorescent light signal when information is stored on the luminescent data storage medium; measuring means for measuring the emitted fluorescent light signal; and a means for rotating the luminescent data storage medium and means for rotating of the vector of polarization of the optical source, wherein an optical c-axis of the luminescent data storage medium rotates synchronously and is parallel to the vector of polarization of the optical source.

According to a ninth broad aspect of the present invention, there is provided an apparatus comprising: a luminescent data storage medium comprising $Al_2O_3$; and an optical source for erasing information from the luminescent data storage medium; and means for rotating a vector of polarization of the optical source, wherein an optical c-axis of the luminescent data storage medium rotates synchronously and is parallel to the vector of polarization of the optical source.

Other objects and features of the present invention will be apparent from the following detailed description of the preferred embodiment.

BRIEF DESCRIPTION OF THE DRAWINGS

The invention will be described in conjunction with the accompanying drawings, in which.

DETAILED DESCRIPTION OF THE PREFERRED EMBODIMENT

Figure 1:
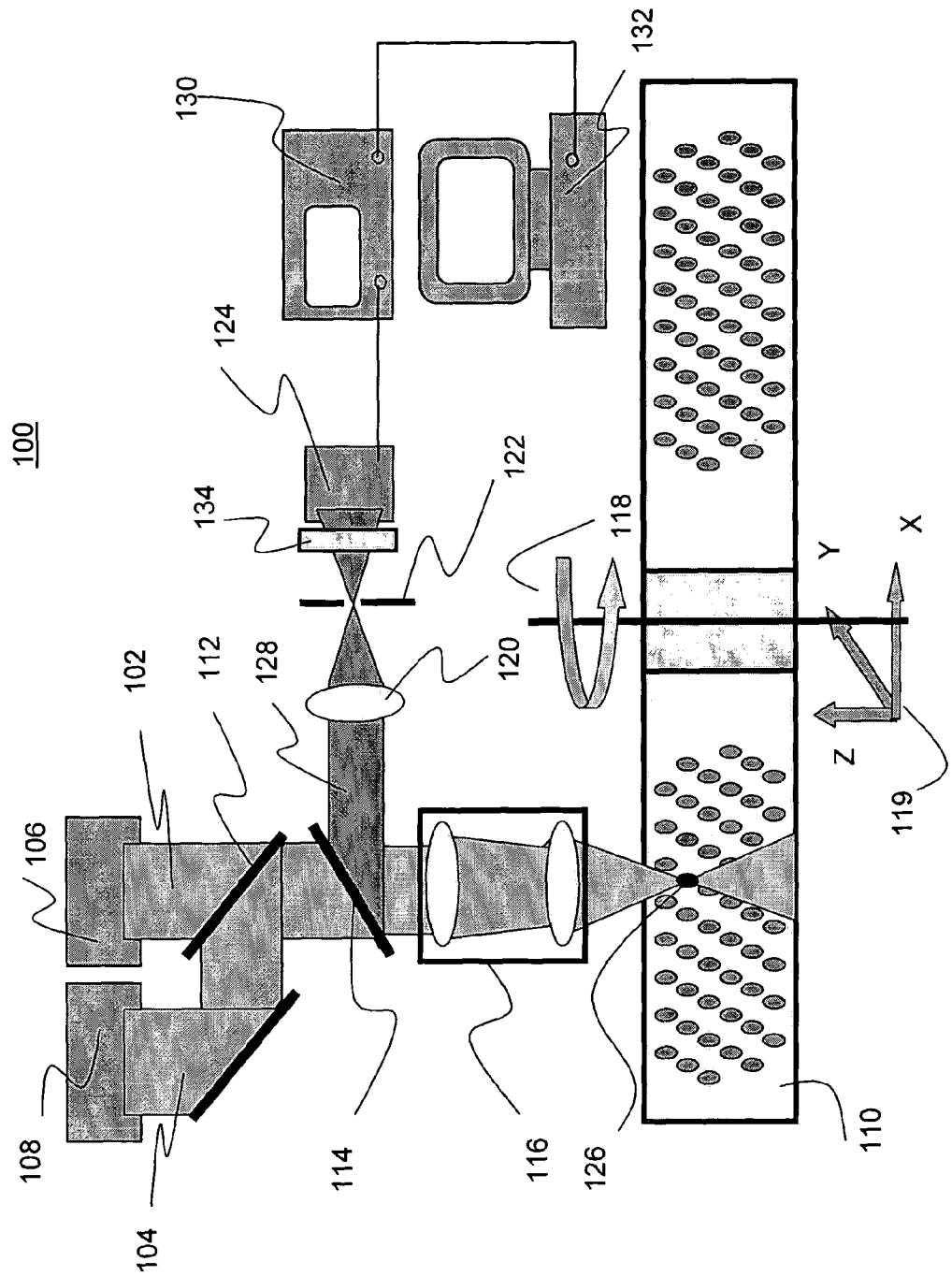
FIG. 1 is a schematic diagram illustrating writing information to a data storage medium of the present invention using a two-photon absorption and reading information from a data storage medium of the present invention using laser-induced fluorescence with a confocal detection scheme.

It is advantageous to define several terms before describing the invention. It should be appreciated that the following definitions are used throughout this application.

Definitions

Where the definition of terms departs from the commonly used meaning of the term, applicant intends to utilize the definitions provided below, unless specifically indicated.

For the purposes of the present invention, the term "writing" refers to the conventional meaning of the term "writing" with respect to storing information on a data storage medium. In a preferred embodiment of the present invention, information is written to a data storage medium using a "write" laser beam of one or more frequencies.

For the purposes of the present invention, the term "write position" refers to positioning a data storage medium to a position at which the data storage medium may be written to by a laser beam.

For the purposes of the present invention, the term "modulation depth of a fluorescent signal" refers to the parameter of the optical data storage system determined as the ratio of two fluorescent signals obtained from the same media spot before and after recording/writing.

For the purposes of the present invention the term "multilevel recording" refers to a method of writing information in a storage medium in which upon readout with a reading beam produces a readout value that may be digitized onto several discrete value levels representing more than one bit of digital information.

For the purpose of the present invention, the term "write time" refers to the time during which the writing beam is illuminating the spot on the medium to achieve desired change in the fluorescence signal amplitude (modulation depth of fluorescent signal). Such change in the fluorescence signal amplitude may be as low as 1% or as high as more than 90% depending on the desired modulation depth.

For the purposes of the present invention, the term "reading" refers to the conventional meaning of the term "reading" with respect to retrieving information stored on a data storage medium. In a preferred embodiment of the present invention, information is read from a data storage medium using a laser beam of one or more frequencies.

For the purposes of the present invention, the term "read time" refers to the time a specific storage location is illuminated by the read laser. The read time is equal to the read laser pulse length for stationary media and as a ratio of the reading spot size to the medium velocity for moving the medium.

For the purposes of the present invention, the term "erasing" refers to any of the conventional meanings of the term "erasing" with respect to digital data storage media. In general, erasing refers to restoring one or more sections of a data storage medium containing stored information to a state those sections had before having information stored in those sections.

For the purposes of the present invention, the term "physically erasing" refers to removing or destroying previously stored information on a data storage medium.

For the purposes of the present invention, the term "absorption band in the region of" or "emission band in the region of" refers to an absorption or emission band having a peak in the appropriate region. Sometimes the region may be a particular wavelength and sometimes the region may include a range of wavelengths indicating a possible shift in a band peak position.

For the purposes of the present invention, the term "crystalline material" refers to the conventional meaning of the term "crystalline material", i.e. any material that has orderly or periodic arrangement of atoms in its structure.

For the purposes of the present invention, the term "luminescent material" refers to any of the conventional meanings of the term "luminescent material".

For the purposes of the present invention, the term "data storage medium" refers to a medium upon which data may be stored, generally in digital form.

For the purposes of the present invention, the term "luminescent data storage medium" refers to a data storage medium that is comprised in part or in its entirety of a luminescent material.

For the purposes of the present invention, the term "defect" refers to the conventional meaning of the term "defect" with respect to the lattice of a crystal, i.e. a vacancy, interstitial, impurity atom or any other imperfection in a lattice of a crystal.

For the purposes of the present invention, the term "oxygen vacancy defect" refers to a defect caused by an oxygen vacancy in a lattice of a crystalline material. An oxygen vacancy defect may be a single oxygen vacancy defect, a double oxygen defect, a triple oxygen vacancy defect, or a more than triple oxygen vacancy defect. An oxygen vacancy defect may be associated with one or more impurity atoms or may be associated with an interstitial intrinsic defect such as misplaced interstitial oxygen atoms. Occupancy of an oxygen vacancy by two electrons gives rise to a neutral F-center, whereas occupancy of any oxygen vacancy by one electron forms an $F^+$-center. An $F^+$-center has a positive charge, with respect to the lattice. A cluster of oxygen vacancy defects formed by double oxygen vacancies is referred to as an $F_2$-type center. A cluster of oxygen vacancy defects formed by two $F^+$-centers and charge-compensated by two Mg-impurity atoms, which substitute the adjacent native $Al^{3+}$ ions in the $Al_2O_3$ lattice, is referred to as a $F_2^{2+}(2Mg)$-center.

For the purposes of the present invention, the term "F-type center" refers to any one of the following centers: F-center, $F^+$-center, $F_2^+$-center, $F_2^{++}$-center, $F_2^+(2Mg)$-center, $F_2^{++}(2Mg)$-center, etc.

For the purposes of the present invention, the term "color center" refers to the conventional meaning of the term "color center", i.e. a point defect in a crystal lattice that gives rise to an optical absorption of a crystal and upon light excitation produces a photon of luminescence. A color center, an impurity or an intrinsic defect in a crystalline material creates an unstable species. An electron localized on this unstable species or defect performs quantum transition to an excited state by absorbing a photon of light and performs quantum transition back to a ground state by emitting a photon of luminescence. In a preferred embodiment of the present invention, color centers are present in a concentration of about $10^{13}$ cm$^{-3}$ to $10^{19}$ cm$^{-3}$.

For the purposes of the present invention, the term "luminescence lifetime" or "fluorescence lifetime" refers to a time constant of an exponential decay of luminescence or fluorescence.

For the purposes of the present invention, the term "wide emission band" refers to an emission band that has full width at half maximum bigger than 0.1 eV and is a result of strong electron-phonon interaction. One example of a wide emission band is the wide emission band around 520 nm.

For the purposes of the present invention, the term "charge-compensated" refers to a defect in a crystal lattice that electro-statically compensates the electrical charge of another defect. For example, in a preferred embodiment of the present invention, Mg and C impurities may be used to charge-compensate one oxygen vacancy defect, two oxygen vacancy defects, a cluster of these defects, etc. comprising $F_2^{2+}(2Mg)$-centers.

For the purposes of the present invention, the term "two-photon absorption or 2PA" refers to a quantum mechanical process of light absorption by a color center when two photons have been absorbed simultaneously or sequentially by the localized electron of the color center and the electron makes a quantum transition into an excited state or a conduction band of the crystal.

For the purposes of the present invention, the term "one-photon absorption or 1PA" refers to a quantum mechanical process of light absorption by a color center when only one photon has been absorbed by the localized electron of the color center and the electron makes a quantum transition into an excited state without having been transferred to a conduction band of the crystal.

For the purposes of the present invention, the term "multi-photon absorption" refers to a quantum mechanical process of light absorption by a color center, when more than one photon has been absorbed by the localized electron of the color center.

For the purposes of the present invention, the term "laser light power density" or "laser light intensity" refers to a physical quantity measured as an average light energy of the laser beam propagating through the medium per second and divided by the area of laser beam waist.

For the purposes of the present invention, the term "substantially insensitive to room light" refers to a crystalline material that does not change significantly its coloration or concentration of electrons on traps (concentration of unstable species) under ambient light conditions.

For the purposes of the present invention, the term "capable of being used for long-term data storage" refers to a crystalline material that does not change significantly its coloration or concentration of electrons on traps (concentration of unstable species) at ambient temperatures.

For the purposes of the present invention, the term "photo-ionization cross-section" refers to a parameter having a dimension of $cm^2/J$ that determines how much light energy per unit area is required to perform photo-ionization of a color center. The larger the photo-ionization cross-section means less energy per unit area is required to perform ionization (recording of the bit).

For the purposes of the present invention, the term "fluorescence yield" refers to the parameter determined as a ratio of the number of photons emitted by a luminescent material to the number of photons absorbed by this luminescent material.

For the purposes of the present invention, the term "electron trap" refers to a structural defect in a crystal lattice able to create a localized electronic state and capable of capturing free electrons from a conduction band of the crystalline material.

For the purposes of the present invention, the term "hole trap" refers to a structural defect in a crystal lattice able to create a localized electronic state and capable of capturing free holes from a conduction band of the crystalline material.

For the purposes of the present invention, the term "deep trap" refers to an electron or hole trap having a thermal activation energy larger than kT, where T is absolute temperature of the crystal and k is Boltzmann's constant.

For the purposes of the present invention, the term "efficient deep trap" refers to a deep trap which is capable of trapping electrons or holes and which has a sufficient capture cross-section.

For the purposes of the present invention, the term "multilevel optical data storage" or "multivalued optical data storage" refers to the ability of the data storage system to perform recording and reading of data from the same physical location in the medium with a number of quantized data or signal levels more than two.

For the purposes of the present invention, the term "confocal detection" refers to a method of optically detecting a fluorescence signal in which the focal plane inside the medium of the optical read/write head is optically re-imaged onto a plane which contains an aperture or set of apertures having size comparable to or smaller than the diffraction limited spot size of the projected spot of fluorescent data storage medium.

For the purposes of the present invention, the term "spherical aberration compensation (SAC)" refers to a technique for compensating or correcting the spherical aberration that arises when a high numerical aperture objective (of NA of at least 0.35) is focused to a different depth inside the volume of the storage medium. The spherical aberration correction allows to maintain diffraction limited spot size over larger depth of the medium, preferably larger than 500 microns, via dynamically changing the focusing lens properties depending on the depth of the focus inside the medium achieving diffraction limited spot size at the focusing depth.

For the purposes of the present invention, the terms "c-axis" or "optical c-axis" refer to the conventional meaning of these terms in the field of optics. An example of a c-axis is described below and shown in FIGS. 24A and 24B.

Description

The need for high capacity and high transfer rate computer devices for massive data storage has stimulated a search for new types of media that are able to exist in two or more stable configurations. By transferring the storage medium from one configuration into another, one may write and erase the bit of information, whereas by analyzing the configuration of the medium, the reading of the bit is realized. A large number of materials and techniques have been suggested for data storage and data processing, but only a few of these techniques have found a practical application. Because of the large number of requirements, it is extremely difficult to develop a medium for optical data storage devices, which preferably meets all these requirements. The following articles, the contents and disclosures of which are hereby incorporated by reference, describe several of the techniques that have been attempted: E. P. Walker, et al., *3-D Parallel Readout in a 3-D Multilayer Optical Data Storage System*, Technical Digest of Joint International Symposium on Optical Memory and Optical Data Storage, IEEE Catalog, No. 02EX552, pp. 147–149, (July 2002); Optical Data Storage 2001, Proceedings of SPIE, Vol. 4342 (2001); Optical Data Storage 2000, Proceedings of SPIE, Vol. 4090 (2000); International Symposium on Optical Memory and Optical Data Storage 1999, SPIE, Vol. 3864 (1999); Advanced Optical Data Storage: Materials, Systems, and Interfaces to Computers, Proceedings of SPIE, Vol. 3802 (1999); and K. Schwartz, The physics of optical recording, Chapter 4, pp. 89–111, Springer-Verlag, Germany (1993), the entire contents and disclosures of which are hereby incorporated by reference.

Some of the more important requirements that data storage devices preferably meet are: an ability to repeatedly write, read, and erase the data ($>10^6$ cycles); a high density of bits per unit volume or area ($>10^{11}$ $cm^{-3}$); a high data transfer rate ($>10^7$ bit/s); a minimum access time ($<10^{-2}$ s); a long lifetime for the storage medium (>10 years) and non-volatility of the information stored in the storage medium; an environmental stability of medium characteristics; safety of the stored data; and an ability to accomplish data error correction.

Several methods have been attempted to provide storage devices that might be able to compete with or replace conventional magnetic induction methods to achieve desirable characteristics. Among the methods attempted have been to use: magneto-optic and electro-optic effects (Pockels effect, Kerr effect, Faraday effect, photorefractive effect, etc.), the photochromic effect in dye polymers and inorganic crystals, and phase transformation in the storage medium at the spot being heated with a laser beam. Some of these methods have been successfully realized in the form of phase change media in the form of CD-RW and DVD-RW, and magneto-optical WREM (Write-Read-Erase-Memory) discs and drives that are already on the market. Other methods, such as near-field, solid immersion lens recording, and atomic force microscopy are merely contemplated, see Ingolf Sander (Constellation 3D, Inc.), *Fluorescent Multilayer Technology*, Alternative Storage Technologies Symposium 2001, Monterey Calif., Jun. 26, 2001, the entire contents and disclosure of which is hereby incorporated by reference.

Most of the conventional techniques mentioned above that use 2D (thin film) media are approaching a fundamental limit of storage density caused by a minimum achievable focused laser light spot or in the case of magnetic recording by thermal instabilities of magnetic domain walls (super paramagnetic effect). The most promising way to overcome these limitations may be to use volumetric (3D-space) recording. Among 3D types of data storage, the types of data storage that have been investigated, most have been in the area of digital holography, see Holographic data storage, (eds.: H. J. Coufal, D. Psaltis, G. Sincerbox), Springer 2000, p. 488, and volumetric multilayer single-bit recording, see Confocal and Two Photon Microscopy, Foundations, Applications, and Advances, (ed. Alberto Diaspro) Wiley-Liss, 2002, p. 567; the entire contents and disclosures of the above references are hereby incorporated by reference.

Several kinds of materials, such as photopolymers, photochromic materials and photorefractive crystals, have been proposed as possible recording media with a confocal detection scheme when one bit in the volume of the medium may be written as a local refractive index change using two-photon absorption (2PA) of a high peak-power short pulse laser beam and the recorded data is read by measuring the change in reflection of the read laser light, see U.S. Pat. No. 5,289,407 to Strickler, et al.; James H. Strickler, Watt W. Webb, Three-dimensional optical data storage in refractive media by two-photon point excitation, Optics Letters, Volume 16, Issue 22, 1780–82, November 1991; Y. Kawata, H. Ishitobi, S. Kawata, Use of two-photon absorption in a photorefractive crystal for three-dimensional optical memory, Optics Letters, Volume 23, Issue 10, 756–758, May 1998; A. Toriumi, J. M. Herrmann, S. Kawata, Nondestructive readout of a three-dimensional photochromic optical memory with a near-infrared differential phase-contrast microscope, Optics Letters, Volume 22, Issue 8, 555–557, April 1997; M. Ishikawa, Y. Kawata, C. Egami, O. Sugihara, N. Okamoto, M. Tsuchimori, O. Watanabe, Reflection-type confocal readout for multilayered optical memory, Optics Letters, Volume 23, Issue 22, 1781–1783, November 1998; A. Toriumi, S. Kawata, M. Gu, Reflection confocal microscope readout system for three-dimensional photochromic optical data storage, Optics Letters, Volume 23, Issue 24, 1924–1926, December 1998; Min Gu, Daniel Day, Use of continuous-wave illumination for two-photon three-dimensional optical bit data storage in a photo-bleaching polymer, Optics Letters, Volume 24, Issue 5, 288–290, March 1999; Yoshimasa Kawata, Takuo Tanaka, Satoshi Kawata, Randomly accessible, multilayered optical memory with a $Bi_{12}SiO_{20}$ crystal, Applied Optics-IP, Volume 35, Issue 26, 5308–5311, September 1996; Daniel Day, Min Gu, Andrew Smallridge, Use of two-photon excitation for erasable rewritable three-dimensional bit optical data storage in a photo-refractive polymer, Optics Letters, Volume 24, Issue 14, 948–950, July 1999; Y. Shen, J. Swiatkiewicz, D. I Jakubczyk, F. Xu, P. N. Prasad, R. A. Vaia, B. A Reinhardt, High-Density Optical Data Storage With One-Photon and Two-Photon Near-Field Fluorescence Microscopy, Applied Optics, Volume 40, No. 6, 938–940, February 2001; T. Wilson, Y. Kawata, S. Kawata, Readout of Three-Dimensional Optical Memories, Optics Letters, Volume 21, No. 13, 1003–1005, July 1996; H. Ueki, Y. Kawata, S. Kawata, Three-Dimensional Optical Bit-Memory Recording and Reading With a Photorefractive Crystal: Analysis and Experiment, Applied Optics, Volume 35, No. 14, 2457–2465, May 1996; Min Gu, Confocal Readout of Three-Dimensional Data Bits Recorded by the Photorefractive Effect Under Single-Photon and Two-Photon Excitation, Proceedings of the IEEE, Volume 87, No. 12, 2021–2029, December 1999, the entire contents and disclosures of which are hereby incorporated by reference.

One-bit micro-holograms were suggested as the way to increase bit reflectivity and signal-to-noise and carrier-to-noise ratio (SNR and CNR, respectively), see U.S. Pat. No. 6,322,931 to Cumpston, et al.; U.S. Pat. No. 6,322,933 to Daiber, et al.; H. J. Eichler, P. Kuemmel, S. Orlic, A Wappelt, High-Density Disk Storage by Multiplexed Microholograms, IEEE Journal of Selected Topics in Quantum Electronics, Volume 4, No. 5, 840–848, September/October 1998; Y. Kawata, M. Nakano, Suk-Chun Lee, Three-Dimensional Optical Data Storage Using Three-Dimensional Optics, Optical Engineering, Volume 40, No. 10, 2247–2254, October 2001, the entire contents and disclosures of which are hereby incorporated by reference.

Several types of photochromic materials have been proposed for 3D one-bit optical data storage: organic fluorescent dyes dispersed in a polymer matrix, which undergo chemical or structural conformation, diffusion and polymerization as a result of illumination. Two-photon absorption in fluorescent photopolymers and confocal detection schemes have also been used, see U.S. Pat. No. 5,325,324 to Rentzepis, et al.; D. A. Parthenopoulos and P. M. Rentzepis, Three-Dimensional Optical Storage Memory, Science, Vol. 245, pp. 843–845, 1989; Daniel Day, Min Gu, Effects of Refractive-Index Mismatch on Three-Dimensional Optical Data-Storage Density in a Two-Photon Bleaching Polymer, Applied Optics-IP, Volume 37, Issue 26, 6299–6304, September 1998; Mark M. Wang, Sadik C. Esener, Three-Dimensional Optical Data Storage in a Fluorescent Dye-Doped Photopolymer, Applied Optics, Volume 39, No. 11, 1826–1834, April 2000; E. P. Walker, X. Zheng, F. B. McCormick, H. Zhang, N.-H. Kim, J. Costa, A. S. Dvornikov, Servo Error Signal Generation for 2-Photon Recorded Monolithic Multilayer Optical Data Storage, Optical Data Storage 2000, Proceedings of SPIE Vol. 4090, pp. 179–184, 2000; H. Zhang, A. S. Dvornikov, E. P. Walker, N.-H. Kim, F. B. McCormick, Single Beam Two-Photon-Recorded Monolithic Multi-Layer Optical Disks, Optical Data Storage 2000, Proceedings of SPIE, Vol. 4090, pp. 174–178, 2000; Y. Zhang, T. D. Milster, J. Butz, W. Bletcher, K. J. Erwin, E. Walker, Signal, Cross Talk and Signal to Noise Ratio in Bit-Wise Volumetric Optical Data Storage, Technical Digest of Joint International Symposium on Optical Memory and Optical Data Storage, IEEE Catalog, No. 02EX552, pp. 246–248, 2002; E. P. Walker, W. Feng, Y. Zhang, H. Zhang, F. B. McCormick, S. Esener, 3-D Parallel Readout in a 3-D Multilayer Optical Data Storage System, Technical Digest of Joint International Symposium on Optical Memory and Optical Data Storage, IEEE Catalog, No. 02EX552, pp.

147–149, 2002; and Ingolf Sander (Constalation 3D, Inc.) Fluorescent multilayer technology, In: Alternative Storage Technologies Symposium 2001, Monterey Calif., Jun. 26, 2001, the entire contents and disclosures of which are hereby incorporated by reference.

Using luminescent materials as data storage media is especially attractive because of their ability to realize multilevel (or multivalued) optical data storage. Luminescent response is proportional to the product of the energy deposited in the medium during "writing" and "reading". If the concentration of defects undergoing electronic transition in the volume corresponding to one bit of information is large enough, then that element of the light-sensitive medium may be used in a "gray scale" mode and the optical data storage system may be used as a multilevel (or multivalued) data storage system. The potential storage capacity is increased proportionally to the number of data levels reliably achieved. The total linearity of luminescent response may stretch over several orders of magnitude. Different logical states of the medium may be represented by different intensities of the luminescent signal and digitized using thresholding electronic circuits. In practice, 10 levels of fluorescent intensity may be achieved by changing the energy or the time duration of the laser "writing" beam. An increased density of data storage is one of the main potential advantages of the luminescent techniques of the present invention.

Similar approaches to writing to and reading from a data storage medium have been demonstrated in silver-doped photoluminescent glasses used in radiation dosimetry, see B. Lommler, E. Pitt, A. Scharmann, Optical creation of radio-photoluminescence centers in dosimeter glass by two-photon absorption, Radiat. Prot. Dosim. Vol. 65, No. 1–4, pp. 101–104 (1996), the entire contents and disclosure of which is hereby incorporated by reference. Two-photon UV excitation ("writing") produces a photoluminescence signal that may be repeatedly "read" with the same laser, but at lower power, without measurable erasure of information. However, how such data may be "erased" without heating the medium is not clear. Complications may also be caused by the long-term process of diffusion and luminescent center transformation that lead to a "build-up" of luminescent signal.

A promising way to overcome the limitations of conventional data storage systems is to use volumetric or 3D recording. Among 3D-technologies, multilayer one-bit recording with two-photon absorption (2PA) has some clear advantages. The probability of two-photon absorption is proportional to a square of laser light intensity. Two-photon absorption allows one to perform photo-ionization or photo-transformation of a photosensitive medium only in the vicinity of a tightly focused laser beam without affecting the surrounding volume of the material. The size of one three-dimensional bit or voxel written using 2PA may be made as small as 1×1×3 µm. Extremely high storage density of up to 10 Tbits/in$^3$ is expected.

An apparatus built according to the present invention is illustrated by FIG. 1, described in more detail below. Two lasers based on blue laser diodes are used to write and to read the data from a storage medium. Two-photon absorption from a more powerful CW laser having a shorter wavelength is used for recording the data. High NA of the objective lens allows for the high intensity of the laser light needed for 2PA to be achieved and for the formation of a diffracted limited recorded bit size. One-photon-induced fluorescence induced by low energy and longer wavelength laser and a confocal detection scheme may be used for reading the data. Confocal detection allows one to significantly reduce cross-talk between adjacent bits, tracks, and layers with the purpose of achieving a desirable carrier-to-noise ratio (CNR).

An important objective of the present invention is to provide a method and apparatus that performs writing operation using high probability of 2PA and makes the reading operation non-destructive by decreasing the probability of 2PA during the readout. At the same time the method and apparatus according to the present invention use 1PA and laser-induced fluorescence during readout at a highest possible level needed to achieve acceptable CNR and high data transfer rate.

Most of the problems with the various storage media described above have been related to inadequate material properties. Most of the photopolymers suggested for one-bit or holographic data storage show high sensitivity but exhibit strong dimensional shrinkage. Most of the photo-sensitive polymers may be used only as WORM media (write once, read many times), whereas rewritable photopolymers are still unstable and show significant fatigue when write-read cycles are repeated many times. Even write-once fluorescent photopolymers show strong reduction of fluorescent output signals when read repeatedly. An additional obstacle for most suggested photopolymers and photorefractive crystals tested for volumetric one-bit recording is a necessity of using a femto-second high peak power Ti-sapphire laser to achieve efficient two-photon absorption, because a Ti-sapphire laser is big, expensive and at the time are suitable mostly for laboratory demonstration.

Therefore, utilization of an efficient and stable inorganic photochromic fluorescent material for one-bit optical recording and reading is an objective of the present invention.

The low thermal energy depth of the traps responsible for capturing electrons produced by ionization with the laser light during writing causes thermally stimulated release of electrons from traps at ambient temperatures and fading of the stored data. This is generally not acceptable, especially for multivalued storage, which requires precise digitization of the analog luminescent signal. Furthermore, the chemical instability of some luminescent materials and their sensitivity to oxidization and humidity when contacted with air require the use of protective layers. In some organic fluorescent materials, dimensional stability is a significant problem because of material shrinkage as a result of photochemical transformation and polymerization.

Electronic transitions in solids caused by light excitation with relaxation times on the order of $10^{-12}$ to $10^{-9}$ s are fundamentally very fast and are considered among the most promising quantum systems for massive optical data storage. Luminescence decay time after a pulse of laser stimulation determines the time needed for retrieval of each bit of information and the maximum achievable data transfer rate.

To achieve more stable and reliable data storage and optical processing, one should use chemically, mechanically and thermally stable luminescent materials with deep traps and luminescent centers. To produce such deep centers, one needs to use a wide gap dielectric. Furthermore, these "thermally" and "optically" deep traps require a shorter wavelength of laser light for excitation ("writing"), stimulation ("reading") and restoration ("erasing"). For optical recording, the minimum light spot diameter is equal to: d≈0.5 λn/NA, where NA is the numerical aperture of the optical head, n is the index of refraction of the medium and λ is the wavelength of the laser light. Therefore, blue and UV lasers have a clear advantage against IR lasers for achieving higher storage densities. The latest developments in blue and UV solid state lasers, based on heterostructures of wide gap semiconductors like GaAlN create a real possibility for use of materials with wide energy gaps.

The low energy depth of the traps responsible for the accumulation of the charge carriers leads to the thermally stimulated release of electrons at ambient temperatures and to fading of the stored data. This is not acceptable, especially for multilevel data storage, which requires precise digitizing of the analog luminescent signal. Furthermore, the chemical instability and sensitivity to oxidization and humidity when contacted with air require the use of protection layers.

Corundum or sapphire ($\alpha$-$Al_2O_3$) is an important technological material in many optical and electronic applications. It is used as a host material for solid-state lasers, as optical windows, as a substrate material in semiconductor epitaxial growth and, more recently, as a radiation detector see M. S. Akselrod, V. S. Kortov, D. J. Kravetsky, V. I. Gotlib, Highly Sensitive Thermoluminescent Anion-Defective $\alpha$-$Al_2O_3$:C Single Crystal Detectors, Radiat. Prot. Dosim., Vol. 32(1), pp. 15–20 (1990). In spite of excellent dosimetric properties of carbon-doped $Al_2O_3$ with oxygen vacancies, the luminescent centers in this material (F-centers) have a very long luminescence lifetime (35 ms). However, $\alpha$-$Al_2O_3$ is unacceptable for fluorescent one-bit recording applications requiring a high data transfer rate. Known $Al_2O_3$ materials also do not have absorption bands that may undergo photochromic transitions suitable for volumetric data storage applications.

With respect to the new $Al_2O_3$ crystalline material described in U.S. App. Ser. No. 10/309,021, filed Dec. 4, 2002, and U.S. App. Ser. No. 10/309,179, filed Dec. 4, 2002, the entire contents and disclosures of which are hereby incorporated by reference, important features of this material utilized in the present invention are the electronic and optical properties of a storage phosphor and its defect structure. The $Al_2O_3$:C,Mg crystalline material has color centers absorbing light, stable traps of electrons and holes and its luminescent centers have a short luminescence lifetime.

A simplified scheme illustrating how the crystalline fluorescent material may be used in an optical data recording and retrieving drive is illustrated by FIG. 1. In scheme 100, a 405 nm "write" laser beam 102 and 440 nm "read" laser beam 104 are produced by two diode lasers 106 and 108, respectively. Laser beams 102 and 104 are directed on a single crystalline disk 110 made of $Al_2O_3$:C,Mg through a flipping mirror 112, dichroic mirror 114, and a high NA focusing objective lens 116. Disk 110 spins by air spindle equipped with laser encoder as shown by arrow 118 or moves by a 3D piezo- and stepper-actuated translation stage represented by arrows 119. An optical pick-up head that combines objective lens 116, dichroic mirror 114, focusing lens 120, a confocal pinhole 122, and a photodetector 124 slides along the radius of the disk 110. Selection of the focal depth of the bit 126, a certain data layer within 3D volume of the disk and correction of spherical aberrations are performed by moving an additional optical component of an optical pick-up head (not shown). A photodetector 124 is used to monitor laser-induced fluorescence 128 during writing and reading. A green fluorescence 126 is collected by objective lens 116, reflected by the dichroic mirror 114, focused by lens 120 on confocal pinhole 122, and detected by a photon counter or a digital oscilloscope 130 interfaced with a computer 132.

In the scheme shown in FIG. 1, two-photon absorption during a "write" operation allows for very tight localization of the photo-ionization process in the focal spot of the laser beam and 3D confinement of the written bit (green fluorescence 126). One-photon excitation of the fluorescent light from the medium using "read" laser light of the same or different wavelength and a confocal fluorescence detection scheme allows one to perform non-destructive reading of bits multiple times.

The method described in the present invention is made possible due to the unique optical properties of $Al_2O_3$:C,Mg. The primary information storage process in $Al_2O_3$ is photo-ionization, followed by the subsequent capture of the excited electronic charge by trapping centers. Thus, for the efficient storage of information, it is necessary that $Al_2O_3$ crystals contain both light absorbing color centers and defects capable of trapping electrons. High quantum yield of fluorescence is also required for one-bit confocal recording. According to a preferred embodiment of the present invention volumetric recording of bits is performed using 2PA, whereas non-destructive reading operation utilizes 1PA and fast laser induced fluorescence.

Figure 2:
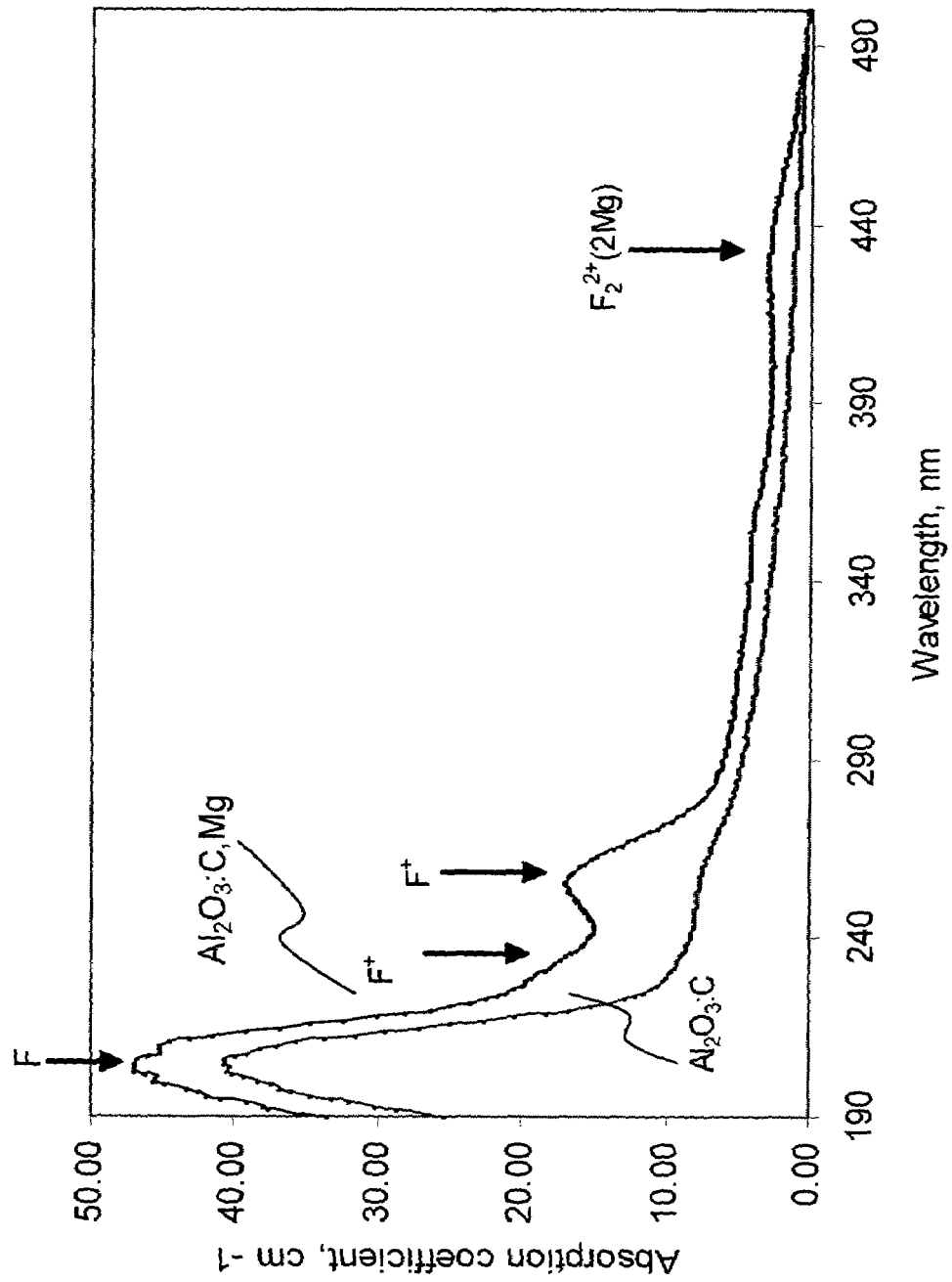
FIG. 2 shows optical absorption spectra of two crystals: a known $Al_2O_3$:C crystal used in radiation dosimetry and an $Al_2O_3$:C,Mg single crystal according to a preferred embodiment of the present invention with a higher concentration of $F^+$-centers (absorption at 255 nm) and new absorption bands corresponding to $F_2^+(2Mg)$- and $F_2^{2+}(2Mg)$-centers clearly distinguishing a new material.
Figure 3:
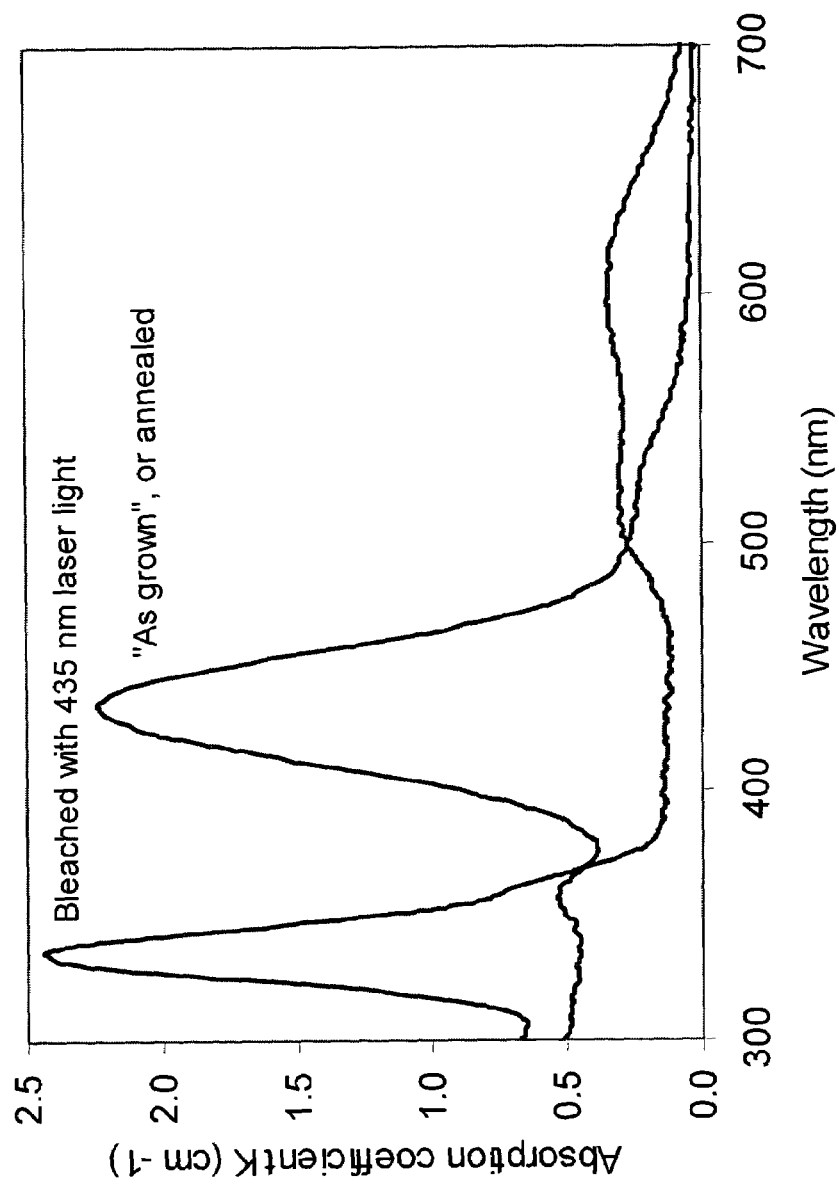
FIG. 3 shows photochromic transformation of 335, 435 and 620 nm absorption bands in $Al_2O_3$:C,Mg crystal during write and erase operations and is a result of two-photon absorption, ionization and trapping of electrons on color centers.

The $Al_2O_3$ crystalline materials produced according to a method described in U.S. App. Ser. No. 10/309,021, filed Dec. 4, 2002, and U.S. App. Ser. No. 10/309,179, filed Dec. 4, 2002, the entire contents and disclosures of which are hereby incorporated by reference, and utilized in the present invention include several types of oxygen vacancy defects and are doped with carbon and magnesium impurities and can be grown by those skilled in the art using any conventional crystal growth method (for example using the Czochralski method). The crystalline material utilized in the present invention is characterized by several optical absorption (OA) bands: at 205, 230, 255, 335, 435, 520, and 620 nm (FIGS. 2 and 3). The blue absorption band at 435 nm is responsible for the visible green coloration of the crystal. One important feature of the new aluminum oxide material is a high concentration of single and double oxygen vacancies in the form of neutral F-centers as well as $F^+$ and $F_2^{2+}$ centers, charge-compensated by the nearby Mg-impurity atoms.

Figure 4:
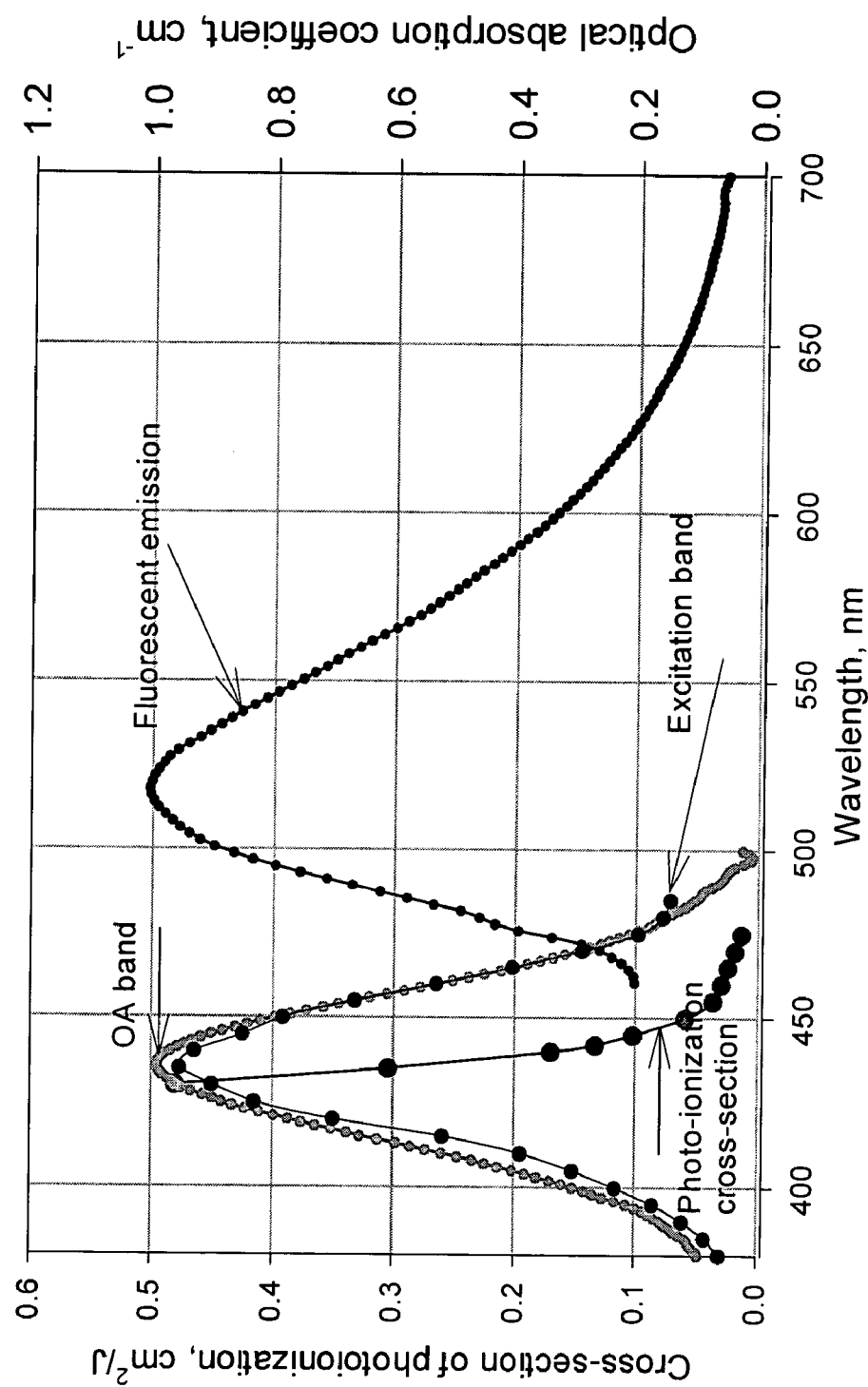
FIG. 4 is a graph showing the absorption, excitation and emission spectra of $F_2^{2+}(2Mg)$-centers created in $Al_2O_3$:C, Mg in an as-received or erased state, with an excitation spectrum of 520 nm emission band coinciding well with the absorption band at 435 nm assigned to the same defect, and showing the wavelength dependence of a two-photon photo-ionization cross-section for $F_2^{2+}(2Mg)$-centers.
Figure 5:
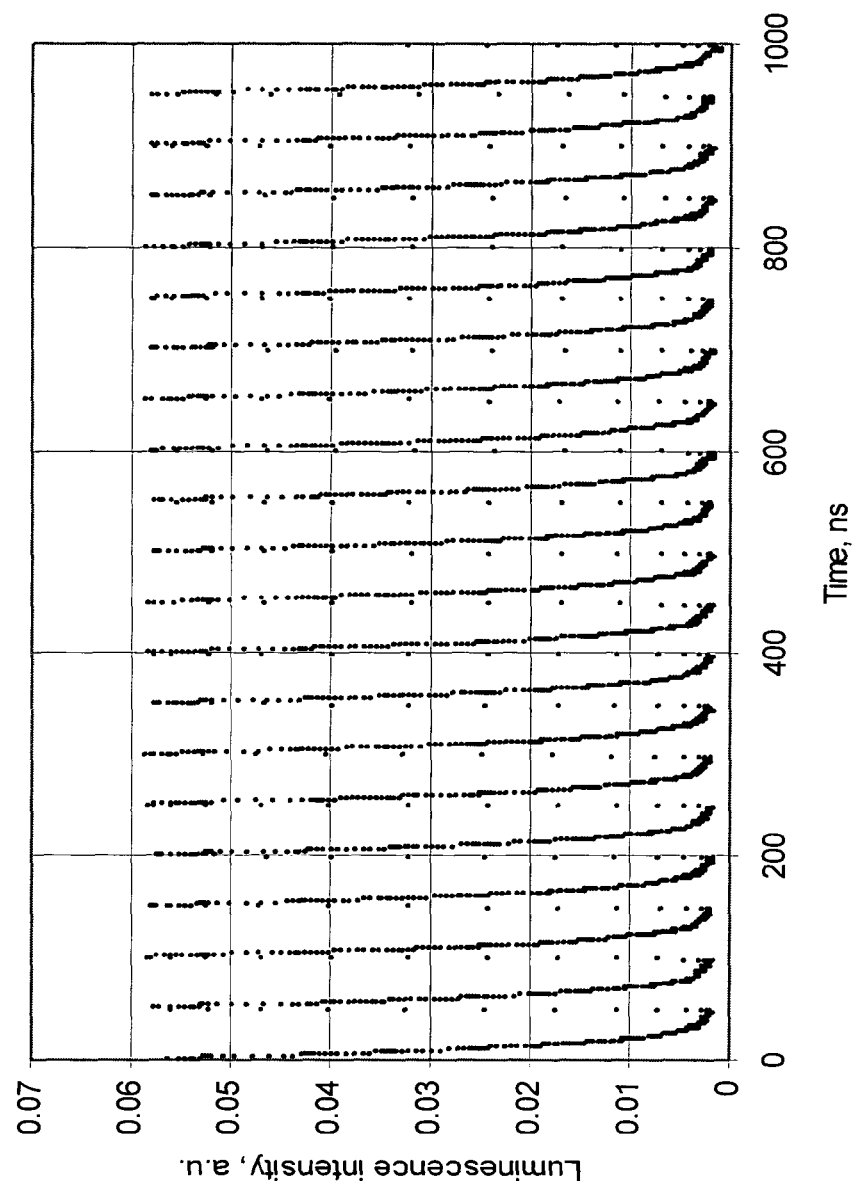
FIG. 5 is a graph showing a continuous readout of fluorescent signal at a 20 MHz repetition rate with the lifetime of $F_2^{2+}(2Mg)$-center emission at 520 nm equal to 9±3 ns for an $Al_2O_3$:C,Mg luminescent material according to a preferred embodiment of the present invention.

An $F^+$-center is an oxygen vacancy with one electron charge-compensated by one $Mg^{2+}$-ion and is denoted as an $F^+$(Mg)-center. This center is characterized by at least two absorption bands at 230 and 255 nm (FIG. 2) and has a luminescence band at 330 nm with a lifetime of less than 5 ns. A cluster of two of these defects forms an aggregate vacancy defect composed of two $F^+$-centers and two Mg-impurity atoms. This aggregate defect with two localized electrons, denoted here as $F_2^{2+}$(2Mg), is favorable for optical data storage. It is responsible for a blue absorption-excitation band at 435 nm (FIG. 4), produces a green fluorescence band at 520 nm, and has a short lifetime equal to 9±3 ns (FIG. 5).

Exposure of an $Al_2O_3$:C,Mg crystal having oxygen vacancy defects to high intensity laser light of appropriate wavelength results in conversion of the same structural defect from one charged state into another. For example, $F_2^{2+}$(2Mg)-centers are converted into $F_2^+$(2Mg)-centers with 430 nm illumination (FIGS. 3 and 6) and may be converted back with 335 nm or 620 nm pulsed laser light. After photochromic transition induced by blue laser light that is defined as a "write" operation, $Al_2O_3$:C,Mg crystals exhibit an absorption/excitation bands at 260, 335 nm and 620 nm (FIGS. 3 and 7), a broad fluorescent emission at 750 nm (FIG. 7) with relatively fast decay time equal to 80±10 ns (FIG. 8).

In a preferred embodiment of the present invention a two-photon absorption (2PA) process is utilized for recording the information in the volume of $Al_2O_3$:C,Mg. Usually 2PA is considered as a process of simultaneous absorption by the luminescence center of two photons. The sum of energies of these two photons is preferably enough to perform excitation of the luminescent center whereas energy of only one photon is not sufficient for the excitation transition. 2PA in that case is performed through the virtual (non-existing) quantum energy state of defect and the probability of it is very low. To perform 2PA, femto- or picosecond laser pulses with a power density on the order of 100 MW/cm$^2$ are required. A very important trait of Al$_2$O$_3$:C, Mg, which enables so-called "sequential" 2PA, is that defects absorbing the laser light and producing the fluorescence have an excited state located deep in the energy gap. The lifetime of this excited state is sufficiently long to significantly increase the probability of a second photon absorption needed for photo-ionization and data recording. At the same time the lifetime of the excited state for this color center is short enough to allow fast reading of a fluorescent signal with a high data transfer rate.

Figure 9:
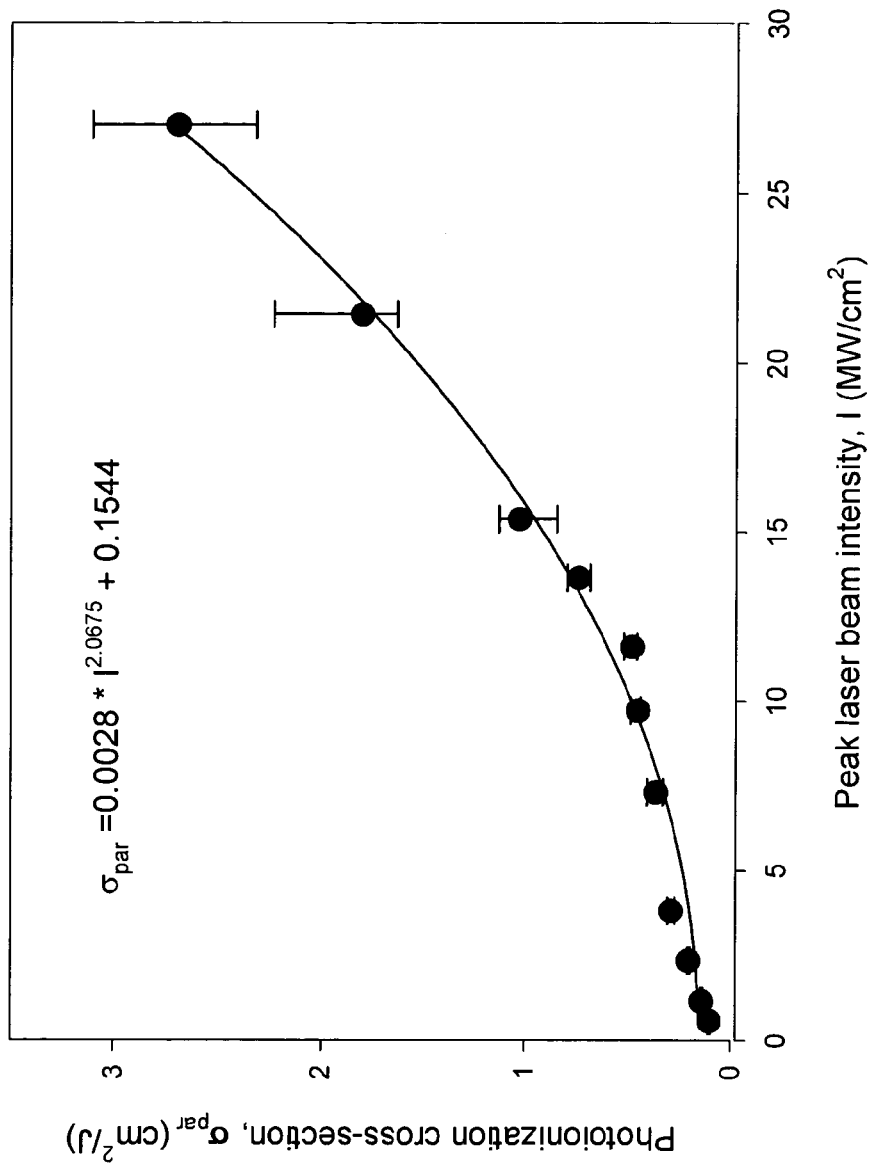
FIG. 9 is a graph showing quadratic dependence of a photo-ionization cross-section of $F_2^{2+}$(2Mg)-centers on peak laser light intensity illustrating high probability of a two-photon absorption process in $Al_2O_3$:C,Mg crystals.
Figure 10:
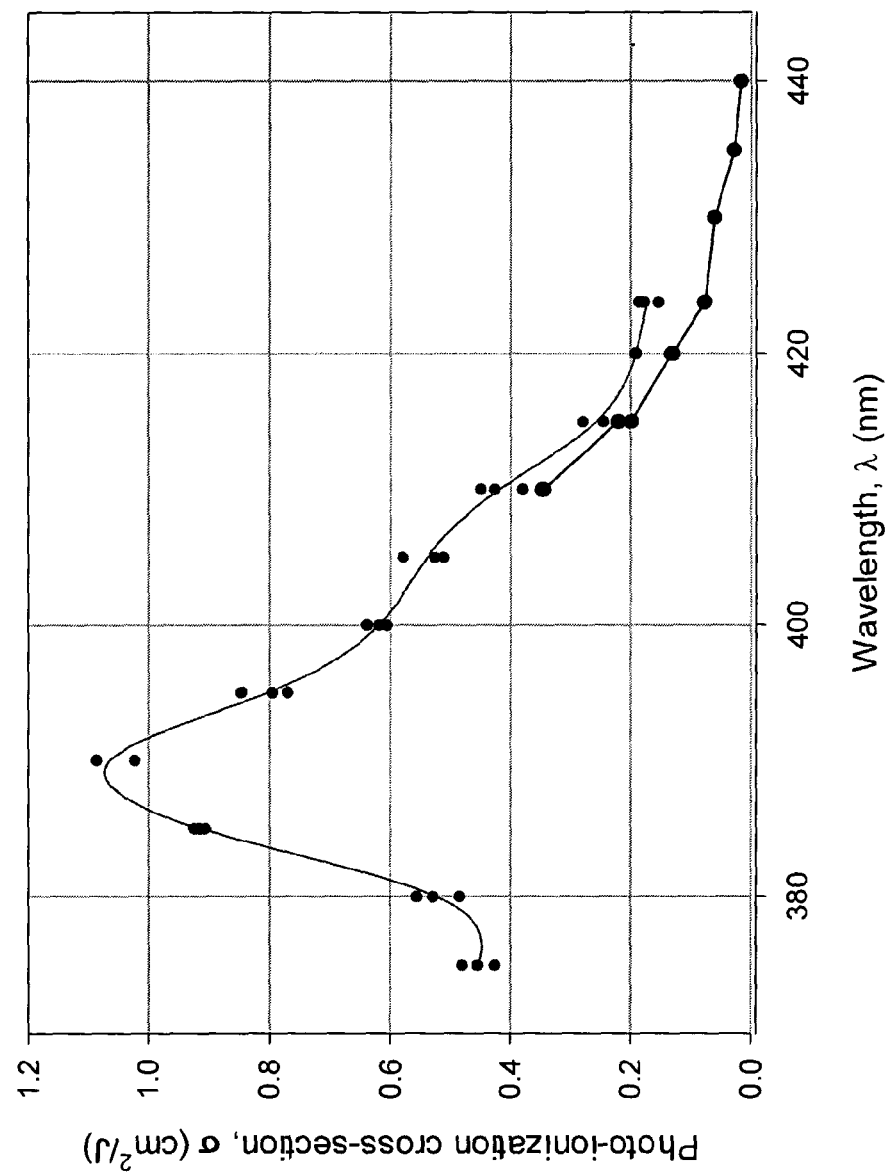
FIG. 10 is a wavelength dependence of photo-ionization cross-section showing an optimum wavelength at about 390 nm to perform "write" operation in $Al_2O_3$:C,Mg.
Figure 11A:
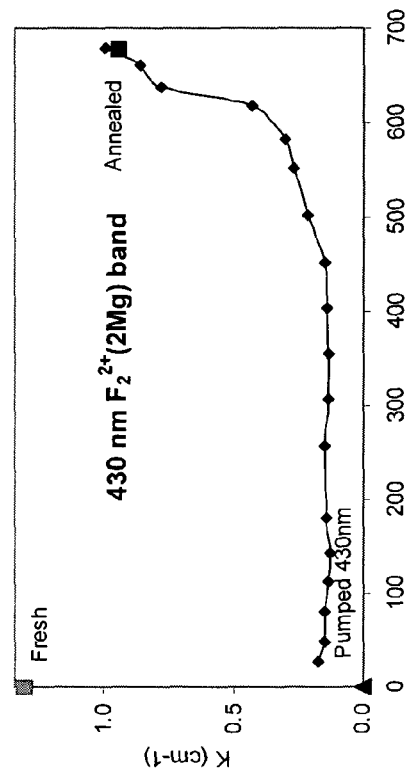
FIG. 11A is a graph showing temperature dependence of an optical absorption band at 255 nm ($F^+$-centers) and illustrates high thermal stability of trapped charge up to 600° C.
Figure 11B:
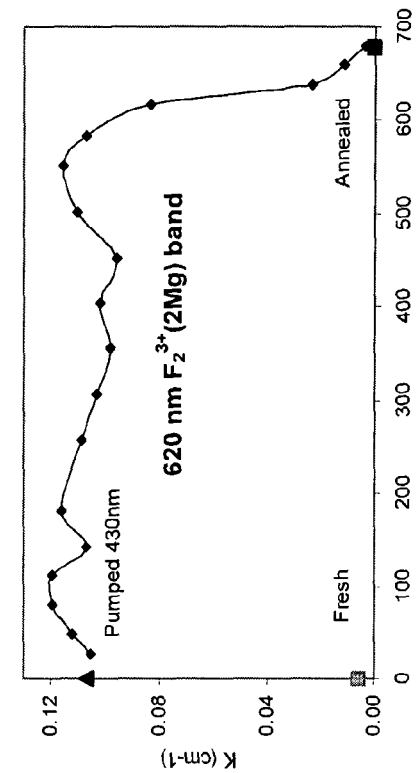
FIG. 11B is a graph showing temperature dependence of an optical absorption band at 335 nm ($F_2^+$(2Mg)-centers) and illustrates high thermal stability of trapped charge up to 600° C.
Figure 11C:
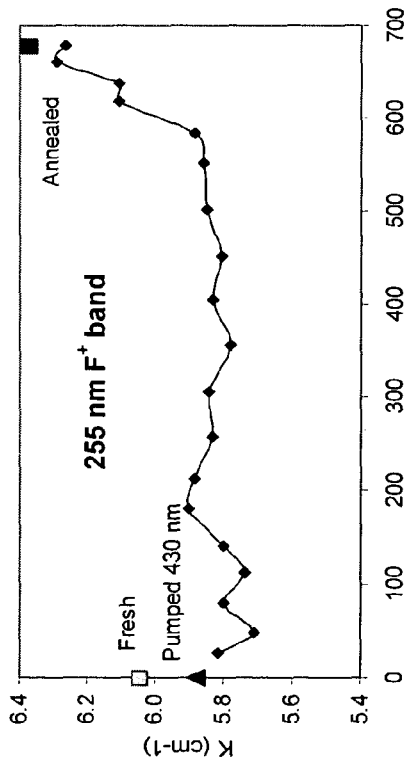
FIG. 11C is a graph showing temperature dependence of an optical absorption band at 435 nm ($F_2^{2+}$(2Mg)-centers) and illustrating high thermal stability of trapped charge up to 600° C.
Figure 11D:
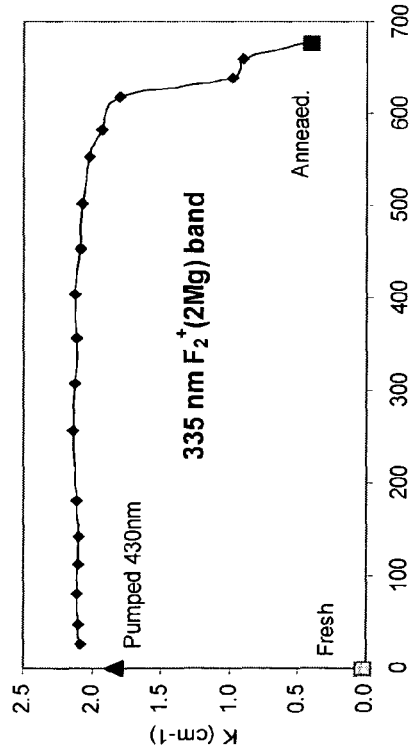
FIG. 11D is a graph showing temperature dependence of an optical absorption band at 620 nm ($F_2^{3+}$(2Mg)-centers) and illustrating high thermal stability of trapped charge up to 600° C.

The evidence of preferred two-photon absorption in aggregate oxygen vacancy defects is provided by quadratic dependence of the photo-ionization cross-section of these centers versus laser light intensity (see FIG. 9). Photo-ionization cross-section for the 2PA process is inversely proportional to the decay constant and directly proportional to the product of the absorption cross-sections of the ground and excited states. Wavelength dependence of photo-ionization cross-section of $F_2^{2+}$(2Mg) centers is shifted to a shorter wavelength in comparison with the 1PA band (FIGS. 4 and 10) and is another indication of the 2PA process in Al$_2$O$_3$: C,Mg crystals.

Erasing of written data and restoration of original optical absorption (coloration) and fluorescence of the storage medium according to the present invention can be achieved optically or thermally. Al$_2$O$_3$:C,Mg crystalline material includes deep traps of charge. These deep traps of charge have a delocalization temperature about 600° C. to 700° C. and have a concentration about $10^{13}$ to $10^{17}$ cm$^{-3}$. The delocalization temperature of these deep traps was found from the optical absorption experiment (see FIGS. 11A, 10B, 11C and 11D) with step annealing of the Al$_2$O$_3$:C,Mg crystal after it was illuminated with a 430 nm pulsed laser light that is equivalent to a "write" operation in the optical data storage system. Optical absorption bands of F$^+$-centers at 255 nm and $F_2^+$(2Mg)-centers at 435 nm increase their intensities and restore their original intensity in the temperature region between 600 and 700° C. The opposite trend may be seen in the same temperature range for 335 nm and 620 nm bands, both assigned to $F_2^+$(2Mg)-centers indicating that these centers convert into $F_2^{2+}$(2Mg)-centers during annealing. Both 335 nm and 620 nm absorption bands of $F_2^+$(2Mg)-centers appear only after "write" operation with the pulsed blue laser light and is not visible in the absorption spectrum of the fresh Al$_2$O$_3$:C,Mg crystal shown in FIGS. 2 and 3.

Figure 12:
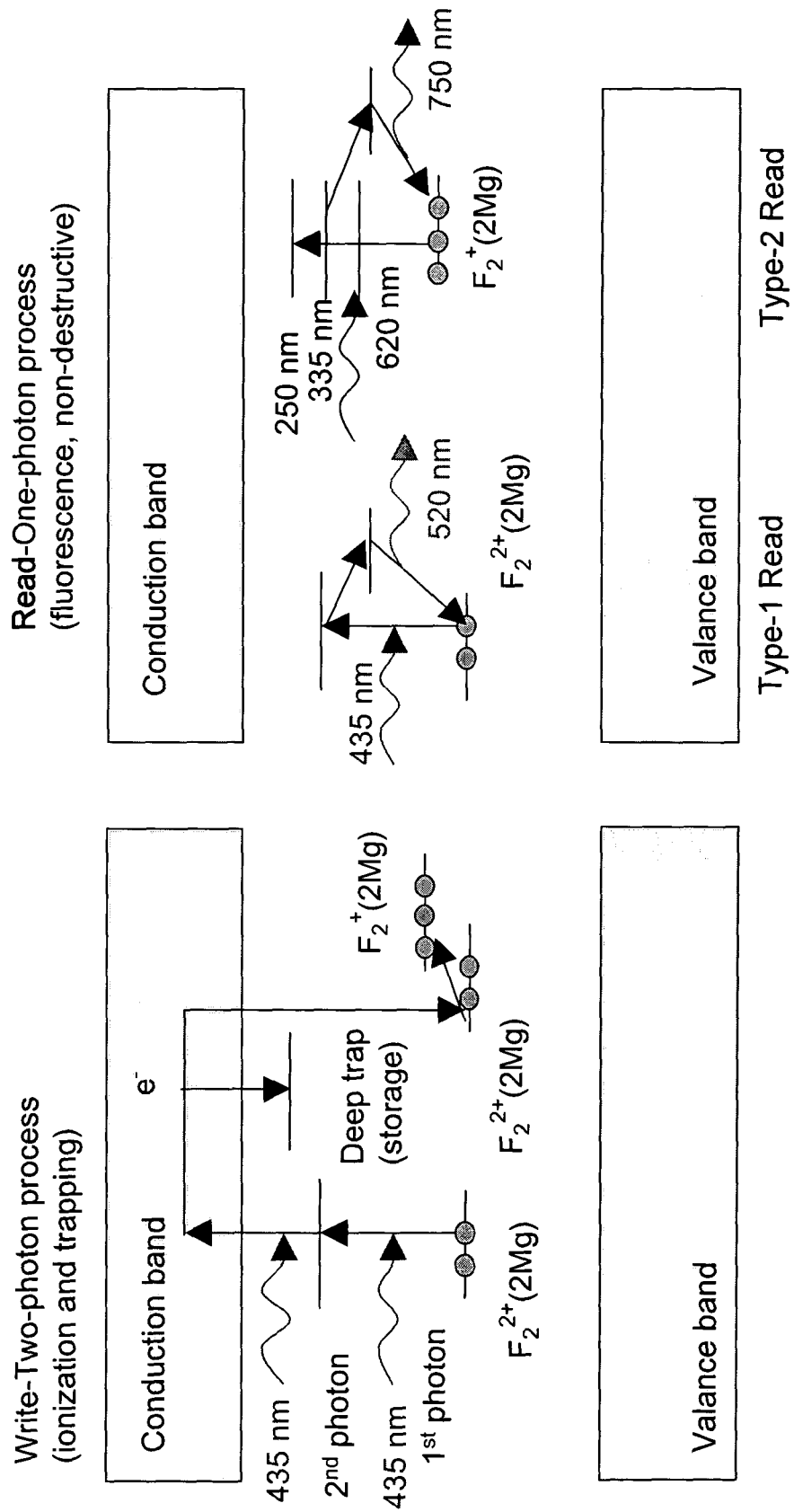
FIG. 12 is a band diagram illustrating electronic processes in an $Al_2O_3$ crystal doped with Mg impurity during "write" and "read" operations.

Preferred electronic processes during "write" and "read" operation in the utilized Al$_2$O$_3$:C,Mg material of the present invention are explained using a band diagram as in FIG. 12. A preferred doped Al$_2$O$_3$ material of the present invention for use as a data storage medium may be formed to contain a high concentration of trapping sites and fluorescent centers with precisely desirable characteristics. Data storage media generally exist in at least two stable physical states assigned correspondingly to "0" and "1" states. An initial configuration (logical 0 state) of as-received or erased Al$_2$O$_3$ medium has a high concentration of $F_2^{2+}$(2Mg)-centers, characterized by an intensive absorption band in the region of 435±5 nm.

By illumination with the writing laser light ("write" beam) of the appropriate photon energy hv$_1$ (or wavelength λ$_1$) and intensity, which is high enough to ionize the above described crystal defects, one may produce free electrons to be trapped in pre-existing electronic defects. The traps in Al$_2$O$_3$:C,Mg are deep enough to keep the charge carriers for a long time at ambient temperature without being thermally released. This second state of a quantum system is now in a metastable "charged" configuration (logical "1" state). To "read" the state of the medium, the stimulation light of the same as writing light or another photon energy hv$_2$ (or wavelength λ$_2$) is applied and fluorescent photon of energy hv$_3$ (or wavelength λ$_3$) is detected. In case of fluorescent one-bit recording, a written bit produces reduced fluorescence intensity whereas an unwritten spot produces original intensive fluorescence.

Electronic defects in wide gap dielectrics like Al$_2$O$_3$ are characterized by the energy levels of their ground and excited states. If the excited state of the electronic defect is located close or within the conduction band, the defect may be ionized by one-photon absorption. A different situation takes place when the excited state is located deep within the energy gap of the crystal. Absorption of one photon corresponding to the energy transition between ground and excited states of the electronic defect results in a localized transition followed by non-radiative and radiative decay (fluorescence). This one-photon absorption process is non-destructive and may be used for reading information.

To remove an electron from such a deep defect and to change the luminescent properties of the particular defect in the crystal, simultaneous absorption of two photons is used in the present invention. The first absorbed photon excites the electron of the above described electronic defect into its excited state, whereas the second photon transfers the electron from the above described excited state within the energy gap into the conduction band. An electron in the conduction band is now delocalized (removed from its original defect site) and may be trapped by another defect.

Writing the data may be performed (see FIG. 12) using two-photon absorption of 435±40 nm blue laser light by the $F_2^{2+}$(2Mg)-centers described above. The first photon excites one of the two electrons localized on the center to its excited state while the second photon performs the second transition between the excited state and the conduction band, thus performing photo-ionization of the center. The final stage of the writing process is localization (or trapping) of the above described photoelectron by another defect, namely by another $F_2^{2+}$(2Mg)-center, or by F$^+$(Mg)-center or by carbon impurity. The result of these photochromic transformations is (a) creation of another charged state of the aggregate defect, $F_2^+$(2Mg)-center, having three localized electrons and characterized by absorption bands at 260, 335 and 620 nm, or (b) creation of a neutral F-center with a UV absorption band at 205 nm, or a carbon related trap responsible for 190° C. TL peak. All three processes result in formation of optically deep and thermally stable electronic states and may be used in a preferred embodiment of the present invention for long-term data storage. The first process (a) has a higher probability that was determined from the efficiency of photo-conversion of optical absorption bands. As a result of photo-ionization, an $F_2^{2+}$(Mg)-center converts into $F_2^{3+}$(Mg) and the released electron is trapped by another $F_2^{2+}$(Mg)-center converting it into an $F_2^+$(Mg)-center having three localized electrons and characterized by an absorption/excitation bands at 260, 335 nm and 620 nm, and an emission band at 750 nm. Both bands centered at 335 nm and 620 nm belong to the same color center, because excitation into either of these bands produce the same 750 nm fluorescent emission with exactly the same 80±5 ns lifetime.

The present invention provides two types of fluorescent processes for reading data (see FIG. 12). The Type 1 or "negative" process involves stimulation of original green fluorescence of $F_2^{2+}(2Mg)$-centers using blue laser light excitation at 435±40 nm. The intensity of this excitation is preferably significantly reduced to avoid two-photon absorption, but sufficient to generate green fluorescence enough for the reliable detection of information. Small volumes of $Al_2O_3$ crystal (voxels) subjected to two-photon ionization during writing show reduced or no fluorescence, whereas the unwritten voxels show high intensity of green fluorescence.

A type 2 readout process of the present invention, the so-called, "positive" readout process, involves using laser excitation at 335±30 nm or 620±50 nm to stimulate the 750 nm fluorescence of $F_2^+(2Mg)$-centers created during recording. One of the preferred readout mode utilizes 620 nm absorption band, because red semiconductor laser diodes are readily available and red laser allows for nondestructive readout of information. The intensity of this readout excitation is preferably reduced to avoid two-photon absorption. The intensity of fluorescence of $F_2^+(2Mg)$-centers in the region of 750 nm having an 80 ns lifetime is used as a measure of data during a readout process for binary or multilevel data storage.

Writing the data on the aluminum oxide medium of the present invention using 2PA and reading of data from the same medium may be performed by means of laser induced fluorescence (LIF) and is preferably achieved through electron motion and electronic transitions. No phase transformation or other structural changes happen during "write" or "read" operations. This makes the data recording and retrieving processes extremely fast and reproducible.

A process of writing data according to a preferred embodiment of the present invention will now be described. First the data storage medium in the form of a Mg-doped anion-deficient $Al_2O_3$ single crystal is moved to a desired position with respect to the diffraction limited laser "write" beam, focused on a predetermined depth of the medium by means of mechanical motion of the medium and/or the adjustable components of the optical head. Spherical aberration compensation of the focused laser beam is also performed at this stage by means of mechanical motion of the optical component or by electro-optical component based for example on liquid crystal phase shifter.

Then, the data storage medium is illuminated with the above-described focused beam of writing laser light having wavelength $\lambda_1$ for the period of time equal to a write time $t_1$. The above described "write" wavelength $\lambda_1$ is in the range of 370–490 nm with a more preferred wavelength equal to 390 nm. The sequential two-photon absorption process described in the present invention can be achieved at laser intensity of higher than 1 kW/cm². The "write" time is in the range of 0.1 ps to 1 ms with a more preferred time equal to 10 ns. The result of the writing operation is ionization and photo-conversion of $F_2^{2+}(2Mg)$-centers into $F_2^{3+}(2Mg)$-centers. This is a two step process, including first excitation, followed by ionization:

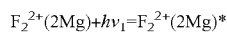

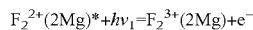

Electrons released from $F_2^{2+}(2Mg)$-centers as a result of the photo-ionization process are captured by deep traps and other nearby $F_2^{2+}(2Mg)$- and $F^+$-centers:

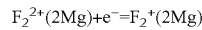

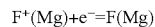

The above-described deep trapping sites are able to store information almost indefinitely.

The present invention provides three preferred modes of reading data using a confocal laser induced fluorescent detection scheme. The first mode reads the data with the same laser beam of wavelength $\lambda_1$ used for "writing", but with significantly reduced intensity and time of illumination to avoid two-photon absorption and erasure of stored data. In the second mode of operation, the reading laser beam has a wavelength $\lambda_2$ longer than $\lambda_1$, but it is still within the absorption band of $F_2^{2+}(2Mg)$-centers. For example, wavelength $\lambda_2$ is selected to be 460 nm. A longer wavelength further reduces the probability of 2PA and allows for higher laser light intensity for excitation of fluorescence and provides better signal-to-noise ratio (SNR). These two modes of "read" operation utilize a fluorescent emission band of $F_2^{2+}(2Mg)$-centers in the region of 520 nm (FIG. 4). Lifetime of this fluorescence is 9±2 ns (FIG. 5) and is fast enough to achieve a 100 Mbit/s data transfer rate. A strong fluorescence signal corresponding to a 0 binary state indicates that no "write" operation was performed on the particular bit. These two first modes of reading may be referred to as "negative" types of operation.

The third and the particularly preferred mode of reading operation referred as "positive" type utilizes fluorescence of $F_2^+(2Mg)$-centers (three electrons occupying the aggregate defect) created as a result of trapping the electron by the $F_2^{2+}(2Mg)$-centers during writing operation:

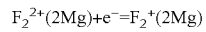

$F_2^+(2Mg)$-centers may be excited in their absorption band in one of three absorption/excitation bands centered at 260, 335 and 620 nm. Emission of these centers is in the infrared region and is in the region of 750 nm (see FIG. 7 for details of excitation and emission spectra). The lifetime of the 750 nm emission is 80±10 ns (see FIG. 8) and is short enough for a data transfer rate up to 10 Mb/s.

A particularly preferred reading operation of the present invention will now be described. First, the above described data storage medium is moved to a desired position with respect to a focused "read" laser beam. The above-described read laser beam has a wavelength $\lambda_2$ is in the range of 600–680 nm with a more preferred wavelength equal to 635 nm corresponding to a readily available red laser diodes. Then, the above described data storage medium is illuminated with the above described focused beam of "read" light for the period of time equal to a "read" time $t_2$. The above described "read" time $t_2$ is in the range of 0.1 ns to 1 ms with the more preferred time in the range between 20 and 1500 ns, and an even more preferred time equal to 100 ns. The laser-induced fluorescence produced by the $Al_2O_3$ data storage medium is then measured using a photodetector. The above-described LIF is the "data" light at the third wavelength $\lambda_3$ in the region of 750 nm and is in the range from 620 nm to 880 nm. The above-described fluorescent signal is then processed to obtain the value of the stored data.

Optical erasure of recorded bits by reverse photochromic transformation and restoration of the 435 nm absorption band and 520 run fluorescence can be achieved according to another preferred embodiment of the present invention using sequential illumination of the $Al_2O_3$:C,Mg crystal with 205±30 and 335±30 nm laser light corresponding to absorption bands of F and $F_2^+$(2Mg)-centers. Illumination with the light at 205±30 nm corresponding to an F-absorption band performs photo-ionization of F-centers and generates free electrons. These free electrons can be captured by the defects ionized during recording. In particular these electrons are captured by $F_2^{2+}$(2Mg) and $F_2^{3+}$(2Mg)-centers. The goal of one of the preferred embodiments of the present invention is to convert as many double oxygen vacancy defects as possible into a $F_2^+$(2Mg) charge state. These defects are characterized by intensive absorption bands in the regions of 335 nm and 620 nm. Ionization of F centers can be performed by either coherent laser light or incoherent light, produced for example by deuterium of xenon lamps. Subsequent illumination of the crystal with the high power density laser light having 335±30 nm performs 2PA on $F_2^+$(2Mg) centers, converts them into $F_2^{2+}$(2Mg)-centers. The described optical procedure restores a 435 run absorption band and 520 nm fluorescence characteristic to these defects and restores original green coloration of the $Al_2O_3$:C,Mg crystal.

Figure 13:
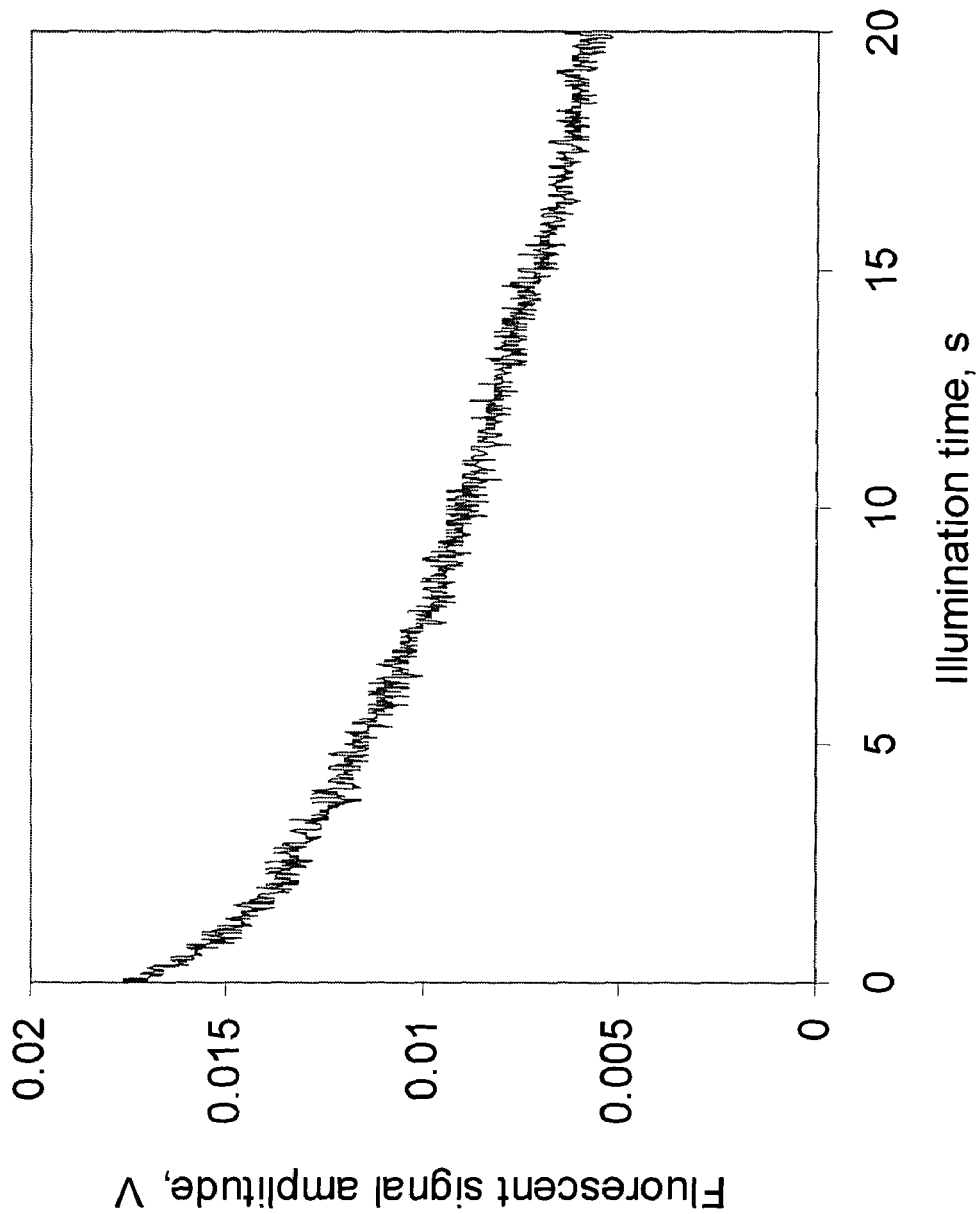
FIG. 13 shows dependence of fluorescent amplitude of the written bit as a function of a 635 nm red laser illumination time and illustrates both stability of data during multiple readout cycles and the possibility to erase bits with high power focused red laser.
Figure 14:
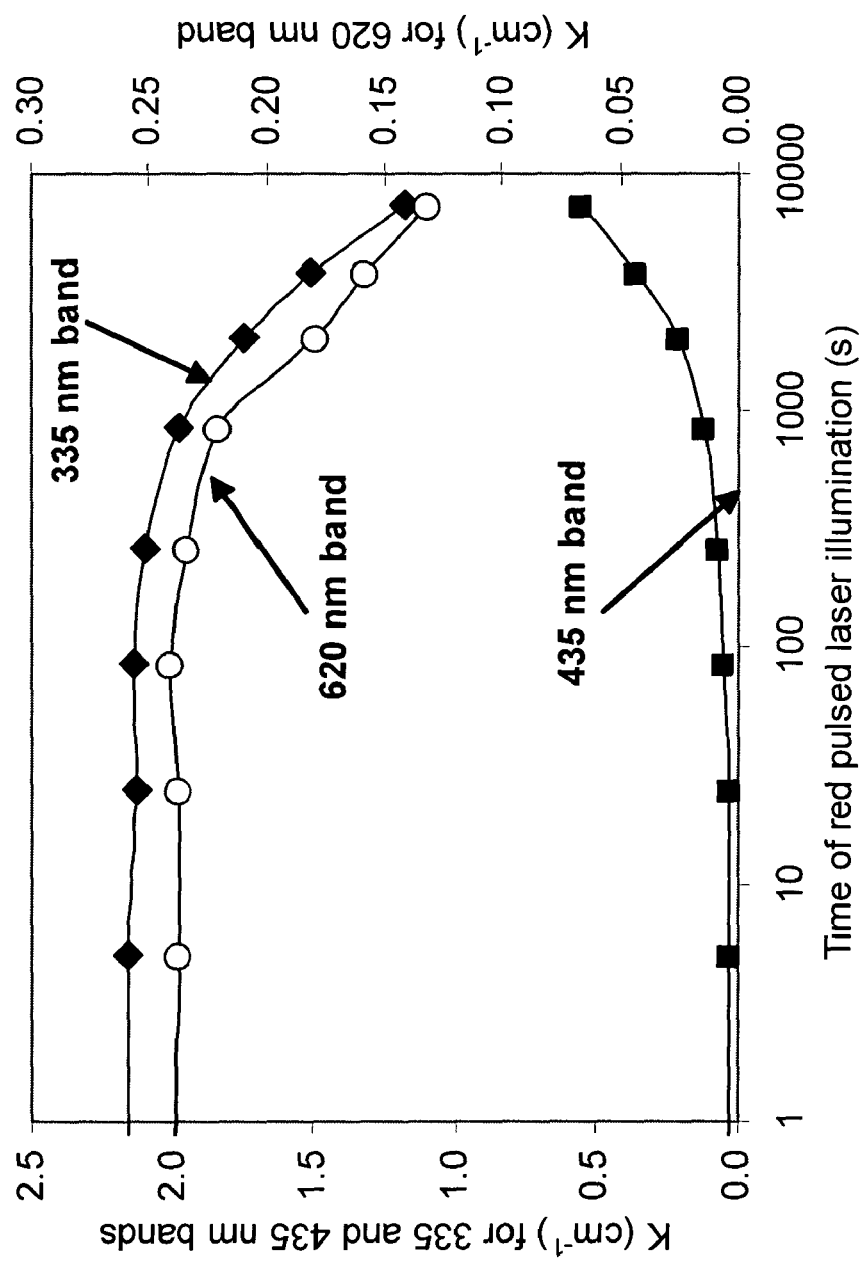
FIG. 14 illustrates the optical erase operation using inverse photochromic transformation between 335 and 620 nm bands characteristic to a written state of the $Al_2O_3$:C,Mg medium and 435 nm optical absorption bands characteristic to an original or an erased state of the medium. The photochromic transformation was performed in condition of multi-photon absorption using high peak power red (620 nm) laser light of an optical parametric oscillator.

Another preferred mode of information erasure in $Al_2O_3$:C,Mg crystals according to the present invention utilizes high peak power density illumination with red laser having a wavelength within 620 nm absorption band. It was demonstrated that continuous illumination of the recorded bits with 633 mm CW laser decreases the intensity of the readout 750 nm fluorescence signal (FIG. 13). Reverse photochromic transformation of 335 and 620 nm absorption bands into 435 nm band was also observed under 620 nm pulsed laser illumination (FIG. 14) and original green coloration of $Al_2O_3$:C,Mg crystal was partially restored.

Figure 15:
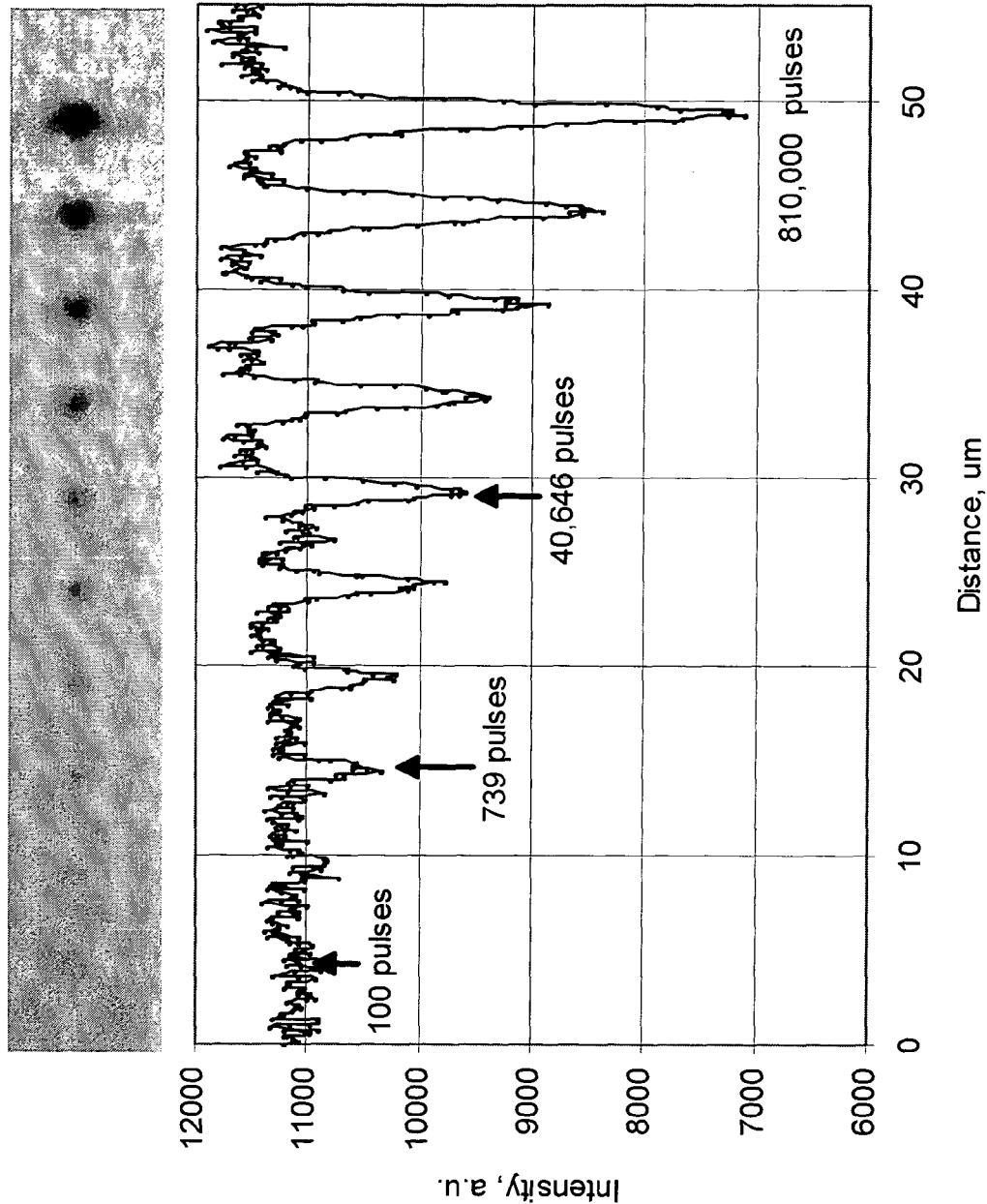
FIG. 15 is a graph demonstrating multilevel one-bit recording by measuring a fluorescent image during XY-scan of $Al_2O_3$ crystal in which 10 bits were written in the volume of the crystal with different numbers of 60 ps "write" laser pulses.
Figure 16:
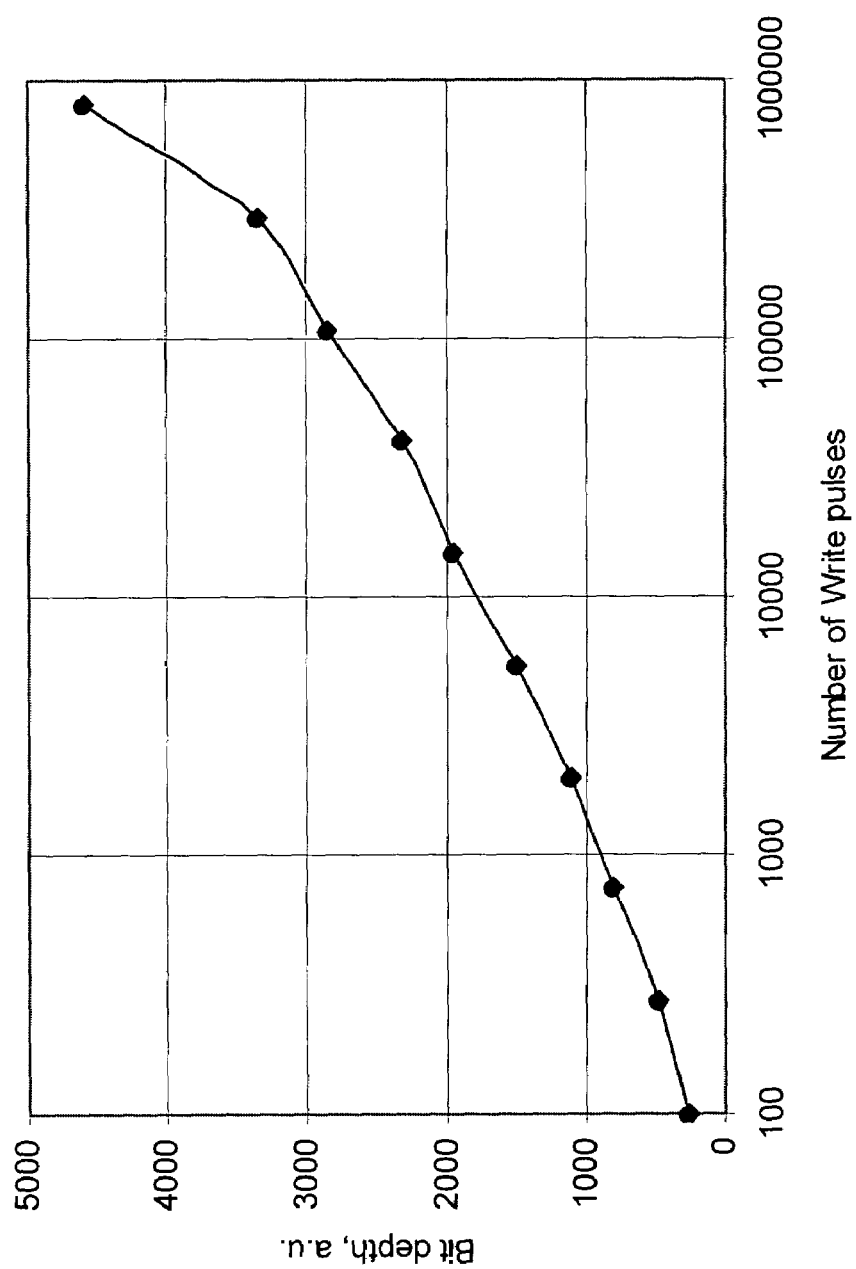
FIG. 16 is a graph illustrating dependence of the modulation depth of bits as a function of number of "writing" laser pulses and demonstrating multilevel one-bit recording.

In another preferred embodiment of the present invention modulation of fluorescence readout signal from the recorded bit is proportional to the amount of energy (or number of "write" laser pulses) delivered to the medium during the recording stage, as shown in FIGS. 15 and 16. The readout signal can be digitized for binary or multilevel types of data and thus can be used for further increase of density of data storage.

The present invention also allows parallel processing of multiple marks on the storage medium for further increase of "write" or "read" rate and data storage density. Parallel processing is one of the main advantages of optical data recording. One may use one-dimensional or two-dimensional arrays of lasers and photo-detectors (CCD chips or CMOS detectors).

The storage medium of the present invention also provides thermal, temporal and environmental stability of the medium and stored data. The common problem for fluorescent and photorefractive data storage medium is the thermal instability and result in thermal erasure of stored information. $Al_2O_3$ doped with carbon and magnesium exhibits extremely good thermal and temporal stability of information stored as electrons trapped on localized states formed by oxygen vacancy defects in the crystal structure. Lifetime of the charge carriers on traps depends on storage temperature. The higher the temperature, the smaller the lifetime. The deeper the traps—the longer the storage time. Most of the trapped electrons are associated with a 650° C. trap that has extremely high thermal and optical depth. $Al_2O_3$ crystals are very mechanically, chemically and optically stable and do not show degradation of performance for years. It was also shown that the recorded data is not erased by conventional room light illumination and the medium does not require light protection.

Figure 23:
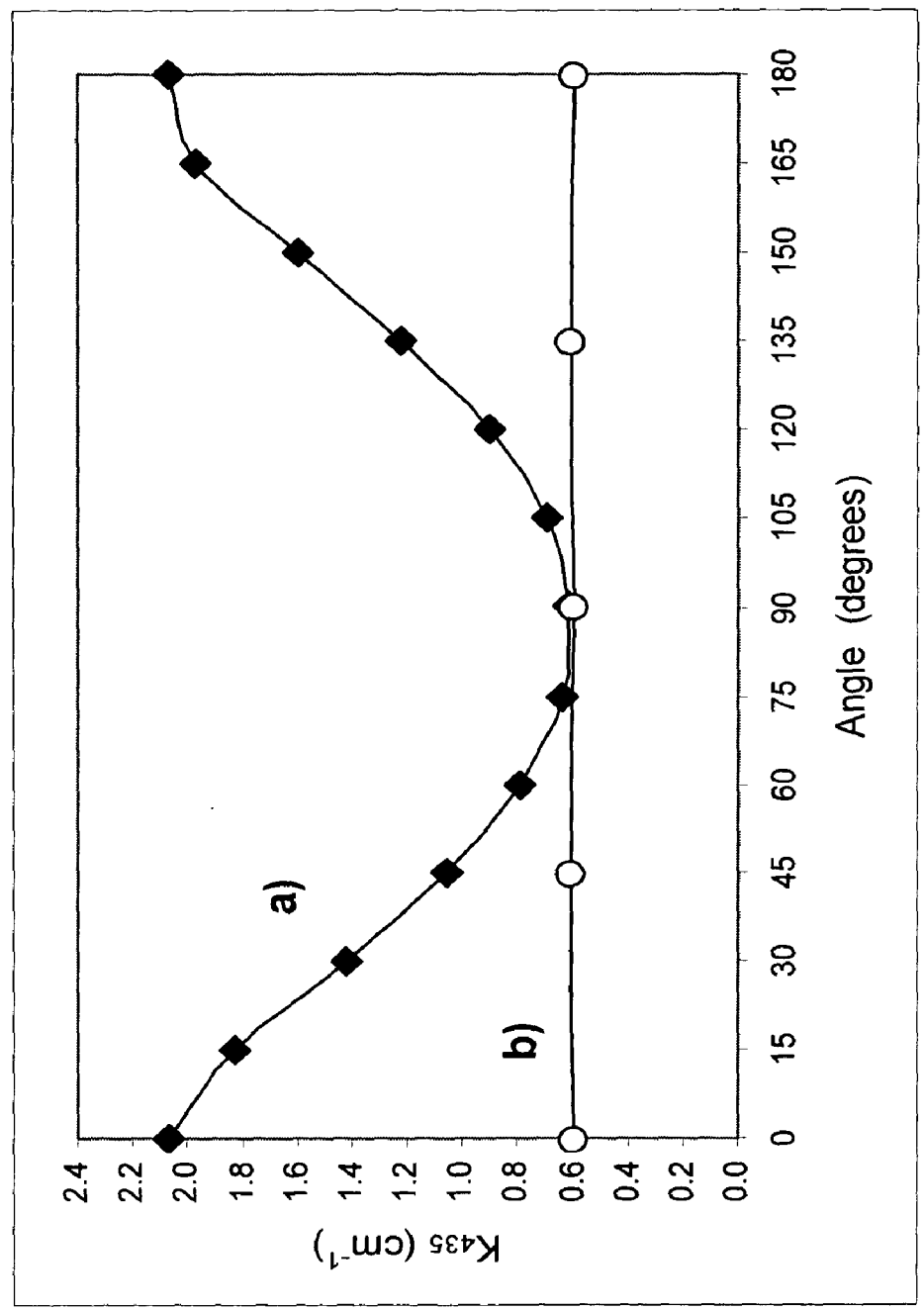
FIG. 23 illustrates the anisotropy of $Al_2O_3$:C,Mg crystal's optical properties and shows angular dependence of coefficient of absorption for the 435 nm band: (a) when an optical c-axis of the crystal rotates perpendicular to the direction of a polarized light propagation and (b) when an optical c-axis of the crystal is parallel to the direction of polarized light propagation.

$Al_2O_3$:C,Mg crystals and color centers created in these crystals during crystal growth demonstrate high anisotropy of optical properties. For example, optical absorption of color centers for the laser light polarized in the direction parallel to the optical c-axis of the crystal is about 2 to 4 times higher than OA of the same light polarized perpendicular to the optical c-axis. It is true for several optical absorption bands including but not limiting to 335 nm, 435 nm, 520 nm, and 620 run absorption bands utilized in the present invention for write, read, and erase operations. An example of the angular dependence for the 435 nm OA band (OA coefficient as a function of the angle of polarization vector with respect to the optical c-axis) is shown in FIG. 23. The practical problem appears when one starts to use the crystal in a form of a rotating disk. For a parallel translation of the medium it should not be an issue, but when rotation of a single crystal disk is used strong anisotropy of OA changes the efficiency of writing, erasing (both have quadratic dependence on absorbed laser light intensity) and reading (direct proportionality for 1-photon absorption). For constant polarization direction of the laser beam the absorption changes as a cosine function within one revolution of the disk. One solution of the problem is illustrated in FIG. 24A.

Figure 24B:
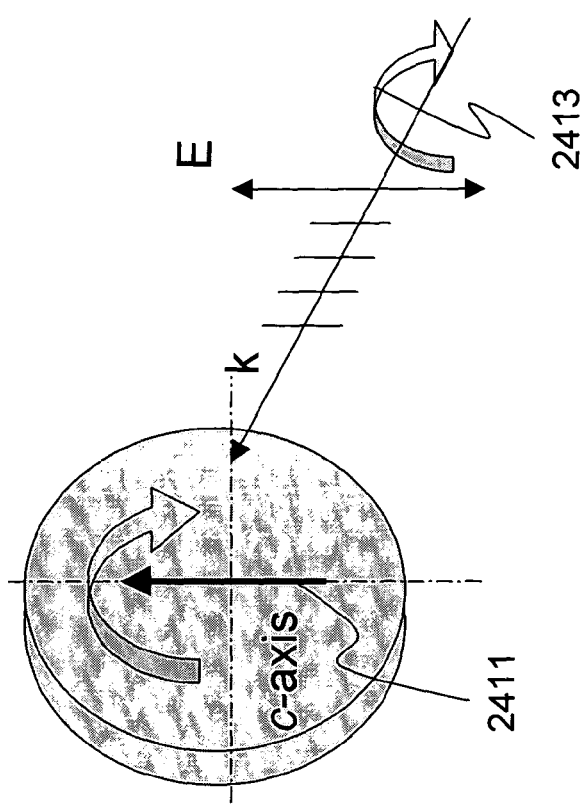
FIG. 24B illustrates another preferred mode of write and read operation using anisotropic single crystal with optical c-axis parallel to the plane of the rotating disk and perpendicular to the direction of the laser light propagation. Polarization direction of the laser light rotates synchronously with rotation of the disk and is parallel to the optical c-axis of the crystal at all times. This mode eliminates dependence of the write, read, and erase efficiencies on the angular position of the rotating disk and at the same time provides higher optical absorption for higher efficiency of write, read and erase operations.
Figure 24A:
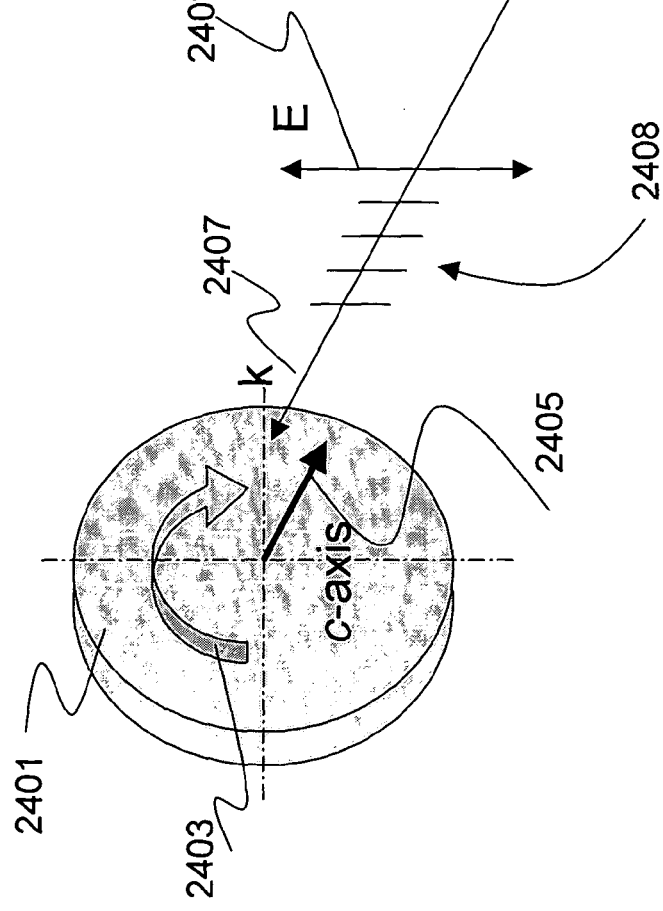
FIG. 24A illustrates one of the preferred modes of write, read and erase operations using anisotropic single crystal with optical c-axis perpendicular to the plane of the disk and parallel to the direction of the laser light propagation. This mode eliminates dependence of the write, read, and erase efficiencies on the angular position of the rotating disk.

FIG. 24A illustrates one of the preferred modes of write, read and erase operations using anisotropic single crystal with optical c-axis perpendicular to the plane of the disk and parallel to the direction of the laser light propagation. This mode eliminates dependence of the write, read, and erase efficiencies on the angular position of the rotating disk. In the mode illustrated in FIG. 24A, a disk 2401 rotates 2403 around disk optical c-axis 2405 that is perpendicular to the plane of disk 2401 and is parallel to a propagation direction (k-vector) 2407 of laser beam 2408 and an optical axis of pick-up head (not shown) and perpendicular to the polarization vector 2409 of laser beam 2408. During rotation of the disk no changes in efficiency in writing, reading and erasing are present. However, the efficiency of writing and erasing is reduced about 10 times and the efficiency of reading is reduced 2 to 4 times because of lower absorption coefficient for this orientation of the crystal c-axis (see FIG. 23).

Another preferred embodiment of the present invention uses the disk with c-axis 2411 been parallel to the plane of the disk and vector of polarization of the laser light parallel to the optical c-axis and the plane of the disk before it enters the objective lens (FIG. 24B). FIG. 24B illustrates a preferred mode of write and read operation using anisotropic single crystal with optical c-axis parallel to the plane of the rotating disk and perpendicular to the direction of the laser light propagation. Polarization direction of the laser light rotates synchronously with rotation of the disk and is parallel to the optical c-axis of the crystal at all times. This mode eliminates dependence of the write, read, and erase efficiencies on the angular position of the rotating disk and at the same time provides higher optical absorption for higher efficiency of write, read and erase operations. In high NA objective due to the refraction of light paraxial rays and off-axis rays have different orientation of the polarization vector with respect to the optical axis of the objective lens, but having polarization vector of light and a c-axis of the crystal parallel to each other is still a preferred orientation. According to a preferred embodiment of the present invention the polarization vector of the laser light rotates 2413 during write, read and erase operation synchronously with the rotation of the single crystal disk in such a way that c-axis of the $Al_2O_3$ crystal is always parallel to the direction of laser light polarization.

In another preferred embodiment of the present invention, the utilized method of optical data storage is capable of being used for long-term data storage.

In another preferred embodiment of the present invention, the utilized method of data recording requires laser energy of as small as 15 nJ per bit of information stored in the material.

In another preferred embodiment of the present invention, the utilized $Al_2O_3$:C,Mg crystalline material is substantially insensitive to room light in both written and erased states.

Compared with known technologies for optical data storage, the present invention provides several advantages. Utilization of fundamentally very fast electronic processes vs. comparatively slow phase change transitions and photo-induced polymerization for well known techniques provides a data transfer rate for one channel of up to 100 Mb/s. High data storage density is achieved due to 3D capability of the proposed materials and confocal detection schemes restricted only by the blue laser light diffraction limit and NA of the optical head. Multiple data layers may be accessed in the bulk of the medium during writing and reading operations using two-photon absorption techniques and confocal detection schemes. Non-volatile reading is achieved using one-photon excitation of fluorescent centers causing no degradation of stored information. Multilevel (multivalue) data storage may further increase data storage density due to linearity of luminescent response. Low average laser light intensities required for "writing" and "reading" of information (mW range) allows one to preferably use compact blue laser diodes. Well-established and efficient crystal growth technology produces $Al_2O_3$ crystals of high optical quality.

The present invention will now be described by way of example. The example experiments described below are meant to be illustrative of the material and procedure described above and should not be considered to be definitive descriptions of the invention.

EXAMPLE I

An optical data storage apparatus of the type illustrated in FIG. 1 was used for demonstrating the methods of the present invention. Both "write" and "read" laser beams were produced by respective semiconductor lasers built using Nichia laser diodes. Two types of writing lasers were tested: CW modulated laser from Power Technology, producing 18 mW of power at 405 nm and a PicoQuant pulsed laser, generating 1.5 mW at 411 nm (20 MHz, 60 ps pulse duration, 400 mW of peak power). Power of the "read" laser (440 nm, 3 mW) from Power Technology was controlled using neutral density filters. The two laser beams were directed on the $Al_2O_3$:C,Mg crystalline storage media through a flipping mirror, dichroic mirror and a Nikon CFI PLAN FLUOR (0.85 NA, 60X) objective lens. This infinity conjugate objective lens has an optical component for manual spherical aberration compensation.

A single crystal disk of $Al_2O_3$:C,Mg was attached to the Polytec PI combined 3D stepper-piezo translation stage having 10 nm resolution. Selection of the focal depth or a certain data layer within 3D volume of the disk and correction of spherical aberrations was performed by moving the crystal 110 in the Z-direction and by rotating the correcting collar on the objective lens. The laser-induced fluorescence was collected by the objective lens and was reflected by the dichroic mirror through a focusing lens on the confocal pinhole. Long-pass yellow glass filter OG-515 134 was installed in front of the PMT to reject the residual blue laser light. Fluorescence detected by the photomultiplier tube was processed either by the digital oscilloscope or by the Stanford Research SR430 multichannel photon counter interfaced with a computer.

Recording of diffraction-limited bits at the different depth of $Al_2O_3$ crystal requires careful spherical aberration compensation (SAC). SAC of the optical system was calibrated using knife-edge technique with a specially made sapphire wedge having a thickness variation from 50 to 300 µm. After the proper focal plane position and optimum SAC were determined, both "write" and "read" laser beam profiles were measured. The diameter of a focused laser beam at $1/e^2$ is equal to 0.55±0.05 µm for a 100 to 240 µm sapphire depth range.

EXAMPLE II

An $Al_2O_3$:C.Mg crystal plate 1.8 mm thick was cut from a crystal boule 45 mm in diameter. It was polished on both sides and installed in the test stand, described in the Example I, perpendicular to the optical axis of the objective lens with the crystal optical c-axis parallel to the polarization of the laser beam. The concentration of color centers responsible for the blue absorption band at 435 nm and green luminescence at 520 nm was estimated to be 17,000 centers per cubic micron.

The test was performed in the following sequence. The "write" operation was done using either modulated CW or pulsed laser diodes controlled by the computer interface board. Both types of lasers gave similar results, but the pulsed laser requires less energy per bit and produces better spatial resolution. The crystal medium was moved in the XY plane in step increments using piezo-actuators. During readout the crystal medium is translated in a ramp mode in X direction and with the step-increments in Y and Z directions. The CW laser beam (15 µW, 440 nm) excited green (520 nm) fluorescence from the crystal medium.

Figure 17:
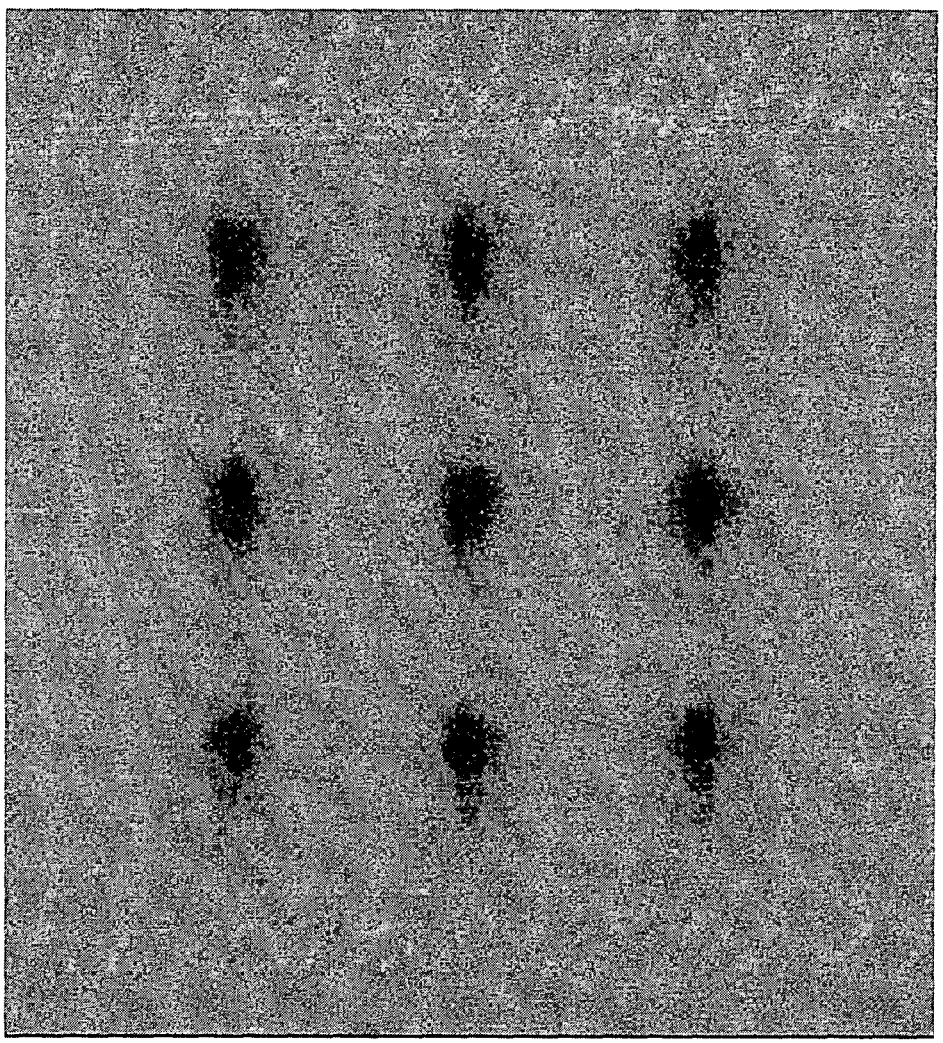
FIG. 17 is a fluorescent image of a matrix of 3×3 bits written in the XY plane of the crystal medium with 5 μm increments using CW 405 nm laser diode and read using a confocal detection scheme and 440 nm CW laser diode.

A high density data storage process for $Al_2O_3$:C:Mg utilizing two-photon absorption during one-bit recording and confocal fluorescent detection scheme for reading is illustrated by the image of FIG. 17. The bit image in fluorescent contrast was obtained using the method described in the present invention and was performed using an apparatus described above in the Example I and depicted in FIG. 1 in the following sequence. The "write" operation was done with a 405 nm diode laser beam at full power and the laser pulse duration was controlled with a TTL pulse from the computer interface board. Decay of the fluorescent signal during writing operation was detected by the PMT and the oscilloscope and it was an indication of the successful writing. During reading operations, a CW low power blue diode laser (0.1 mW, 440 nm) modulated by another sequence of TTL pulses from a computer was used and green fluorescence separated by the dichroic mirror and the confocal pinhole was detected by the PMT and the photon counter.

Matrix of 3 by 3 bits spaced 5 µm apart was recorded and read as an image in fluorescent contrast (see FIG. 17). Nine bits were written with 405 nm laser light and with recording energy of just 25 nJ per bit. The "read" operation was performed by scanning of the recorded area of the crystal storage medium with the modulated CW laser diode having a wavelength at 440 nm that is longer than that of the "write beam" to prevent erasure of the information. To obtain the image of the written bits, scanning of the storage medium was performed with piezo-actuated 3D stage from Polytec PI. The single photon pulses of the fluorescent signal were detected using PMT and a Stanford Research SR430 multichannel photon counter interfaced with a personal computer. Scanning of the crystal was performed at 0.2 μm increments and with a 153 μm/s scan rate. The modulation depth of the recorded bits was about 40% and a full width at half maximum for a single bit was equal to about 1 μm.

EXAMPLE III

Figure 18:
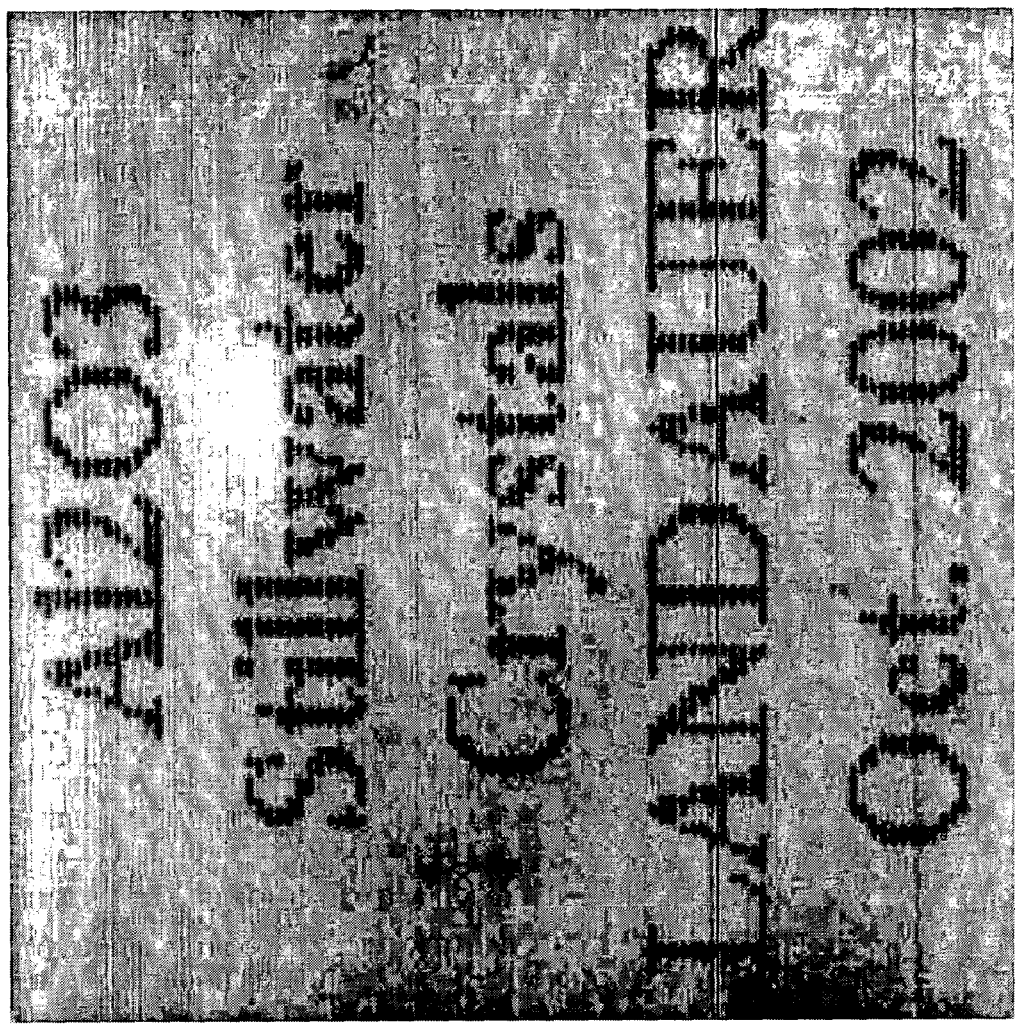
FIG. 18 is a 500×500 pixel image obtained in fluorescent contrast after writing 100×100 bits in the XY plane of the crystal with 1 μm increments in which bits were written with pulses of blue 411 nm laser diode and read with 440 nm laser diode. Readout was performed with Type 1 or "negative" mode of operation, which utilizes 520 nm fluorescent emission of $F_2^{2+}$(2Mg) centers.
Figure 19:
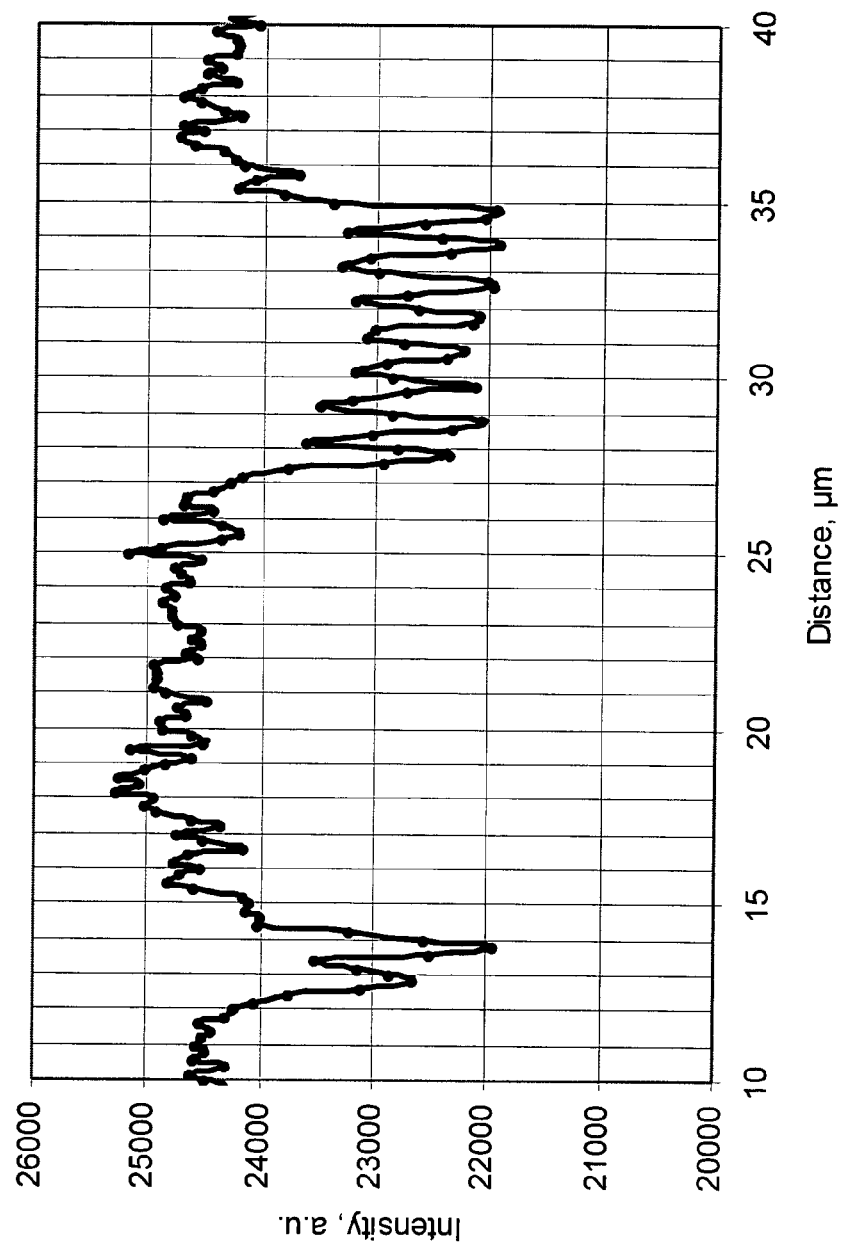
FIG. 19 is a bit profile obtained in fluorescent contrast during X-scan of a crystal showing spatial resolution of the bits written with 15 nJ per bit and 1 μm incremental steps.

High density recording and type 1 or "negative" readout mode utilizing apparatus described in Example I was demonstrated. A 100×100 bit image with 1 μm increments in the X and Y directions (FIG. 18) was written using the 3D piezo-actuator. Each bit was written with 15 nJ of energy produced by pulsed PicoQuant diode laser (1000 pulses per bit). Reading of the bit pattern in fluorescent contrast of green 520 nm emission was performed with a modulated CW-laser beam (440 nm, 15 μW) by scanning a raster with 200 nm between lines. An image having 500×500 pixels was obtained. Spatial profile of several bits spaced 1 μm apart is shown in FIG. 19 and demonstrates a 12% modulation depth.

EXAMPLE IV

Figure 20:
FIG. 20 is a 500×300 pixel image obtained in fluorescent contrast after writing 100×60 bits in the XY plane of the crystal with 1 μm increments. Bits were written with pulses of blue 473 nm laser and read with 633 nm CW laser. Readout was performed using Type 2 or "positive" mode of operation, which utilizes 620 nm absorption band and 750 nm fluorescent emission of F2+(2Mg) centers.

"Positive" or Type 2 mode of reading operation utilizing color centers created during "write" operation and having 335 nm and 620 nm absorption band and 750 nm fluorescence emission band was tested using apparatus described earlier in Example I and depicted in FIG. 1 with some modifications. A red He—Ne laser having wavelength of 632.8 nm was used as a reading laser. Different dichroic mirror transparent at the "write" wavelength of 405 or 473 nm and reflective for the fluorescent light of 750 nm was installed. Another modification of the apparatus include near infrared sensitive avalanche photodetector and 665 long pass filter installed in front of it instead of green sensitive photodetector used in the previous examples. $Al_2O_3$:C,Mg crystal plate similar to that described in Example II was used for the test. Motion of the crystal medium was performed either with the 3D piezo actuator of a static tester or by the air spindle installed on top of the 2D stepper stage of the dynamic tester. Write operation was performed with the computer controlled 405 nm laser diode. Fluorescent signal was detected in confocal geometry by the avalanche photodetector and recorded by the oscilloscope and the computer. The image of bits obtained in the lateral (XY) plane is presented in FIG. 20. Matrix of 100×60 bits was written at the 10 μm depth in the volume of the crystal with 473 nm blue laser and was read in XY plane using red 633 nm He—Ne laser. Recorded and read bits have half-width of 0.8 μm in lateral and 2.5 μm in axial direction. "Positive" mode of operation allows for better signal-to-noise ratio, because in this mode of operation readout fluorescent signal is measured on a small (almost zero) level of background signal, whereas in the "negative" type of read operation the readout signal is measured as a negative modulation of high initial level of green fluorescence.

EXAMPLE V

Figure 21:
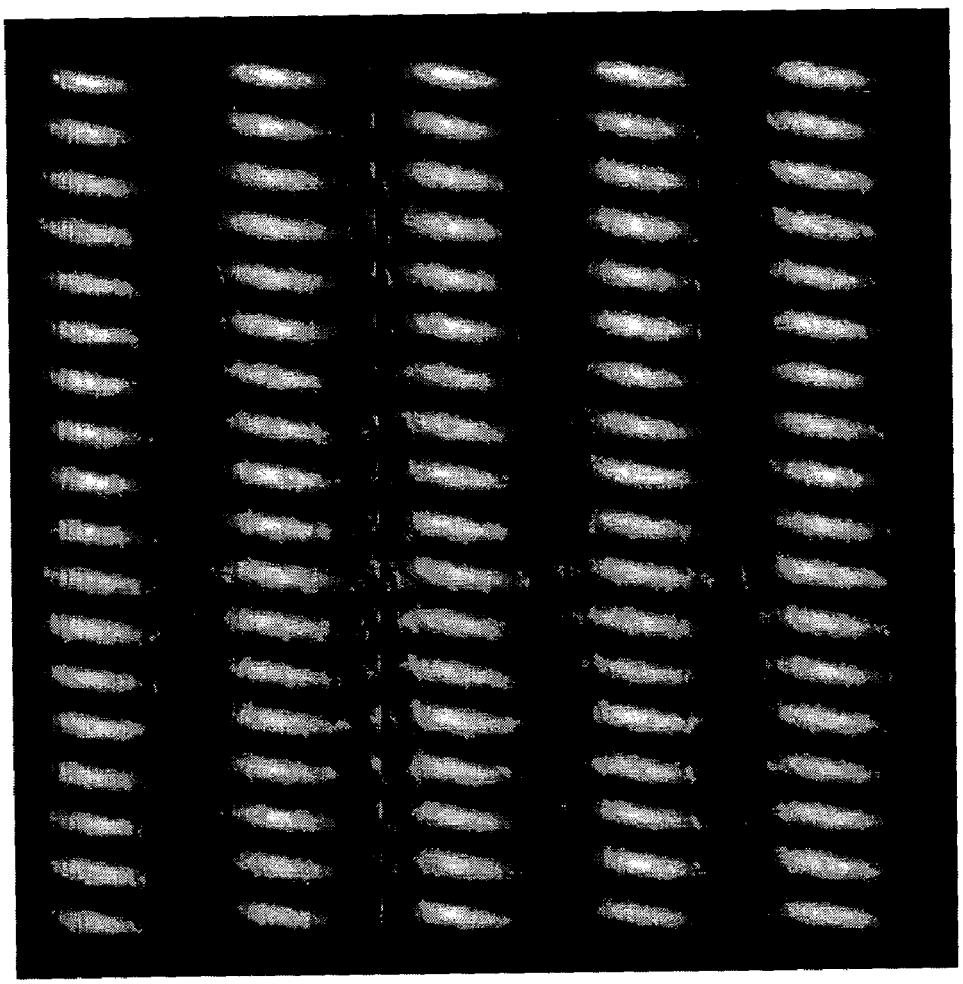
FIG. 21 is an image of 5 layers of bits obtained in fluorescent contrast in the XZ plane of the crystal after bits been written in the volume of the crystal with 2 μm in lateral and 7 μm in axial increments. The bit-image was written with pulses of blue 473 nm laser and read with a 633 nm CW laser and illustrates the possibility to write and read data in multiple layers in the volume of the crystal and preferred the "positive" mode of readout operation, which utilizes 620 nm absorption band and 750 nm fluorescent emission of $F_2^{3+}$(2Mg) centers.
Figure 22:
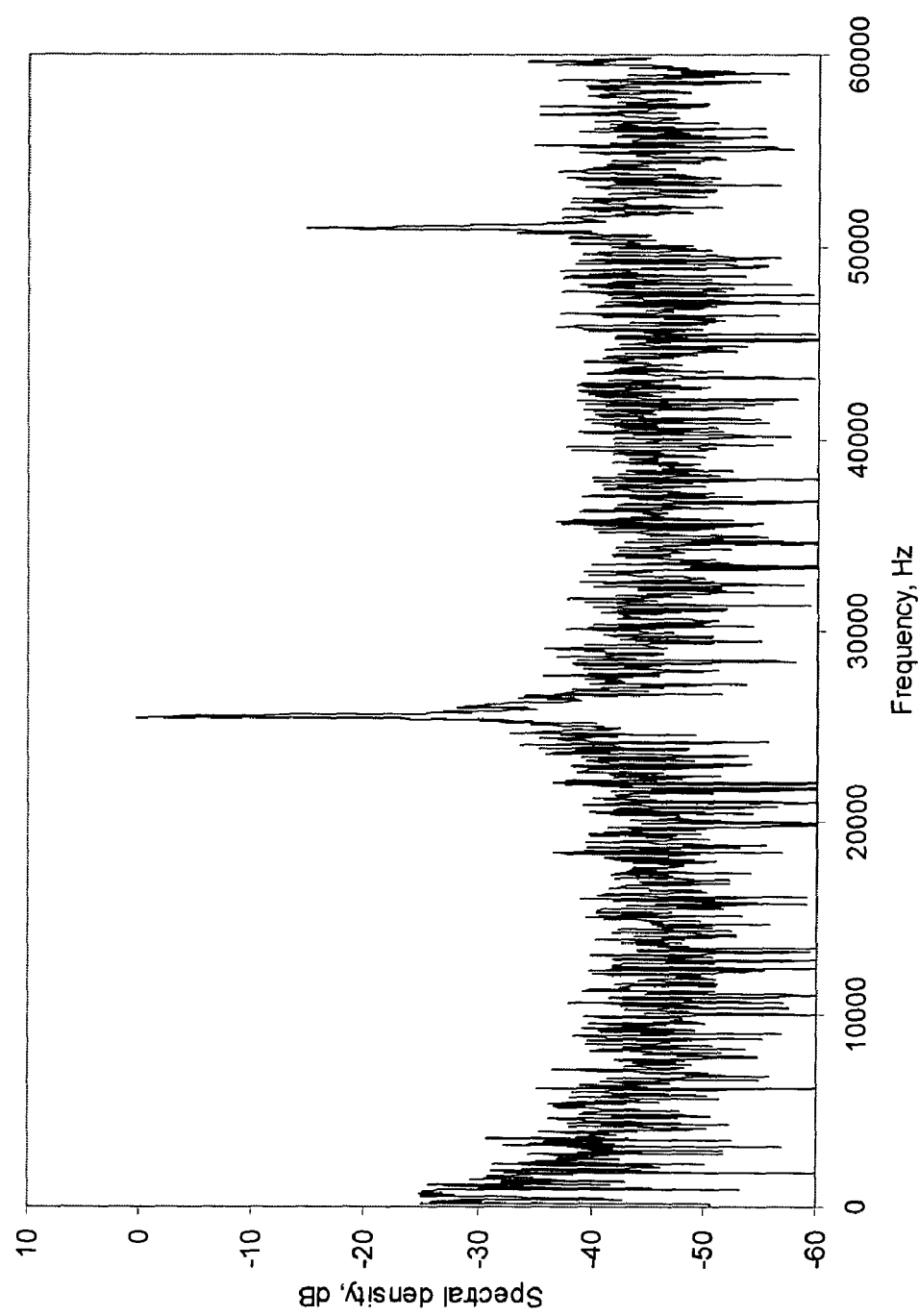
FIG. 22 illustrates carrier-to-noise ratio (CNR) equal to 45 dB for data bits written and read in the volume of $Al_2O_3$:C,Mg crystal. The power spectrum was obtained by FFT of waveform after writing 500 bits with the modulated 405 nm laser diode and read with 633 nm CW laser. Data was obtained utilizing dynamic tester with crystal medium rotating on air spindle with laser encoder. Type 2 or "positive" mode of read operation was used.

In yet another test the possibility of multilayer recording was demonstrated. Five layers of recorded bits were obtained in the volume of $Al_2O_3$:C,Mg crystal medium with 2 μm lateral and 7 m axial translational increment (FIG. 21). Single bits written using 2PA in the volume of the crystal have different dimensions in lateral and axial direction with respect to the laser beam propagation direction. Theoretically axial size of the bit should be 3 to 4 times bigger than lateral bit size. To determine the size of the bits written in the axial direction (XZ plane), bits of data were written using a step increment motion of the 3D translation stage in XZ plane, as described above in Example III, and then the image of the bits in fluorescent contrast was obtained by raster scanning of the crystal in the XZ plane with 633 nm laser beam. Each layer of bits was recorded and read with manual control of spherical aberration compensation (SAC) of the objective lens, which explains some distortion of the fluorescent image. Automated SAC should allow one to obtain up to 300 layers of data bits in the volume of the crystal having 2 mm in thickness.

EXAMPLE VI

Optical stability and optical erasure of data utilizing red laser stimulation was demonstrated. First stability of written data bits in the volume of $Al_2O_3$:C,Mg single crystal medium was tested using apparatus depicted in FIG. 1 and write/read technique described in Example III. Data bits were written using blue 473 nm laser. Then the track of data in the storage medium was scanned multiple times with 633 nm He—Ne laser having 3 mW of power to obtain the dependence of fluorescence amplitude of the data signal as a function of number read cycles and total illumination time. FIG. 13 illustrates the depletion of the fluorescent signal as a function of total illumination time. In one second of total illumination (that is equivalent to $1 \times 10^6$ read cycles at 1 MHz of data rate) with the highly focused laser beam the data signal degraded only by 5%.

EXAMPLE VII

The preferred method of optical erasure of data according to the present invention is illustrated in this Example by using pulsed red (620 nm) laser stimulation. Single crystal of $Al_2O_3$:C,Mg was first converted into a "written" state by 435 nm pulsed laser illumination of Continuum Panther optical parametric oscillator (OPO) tuned to 435 nm wavelength of a signal beam and an optical absorption spectrum of the crystal was recorded. Than the crystal was subjected to a set of illuminations with 620 nm pulsed laser light from the same OPO and intensities of all absorption bands were recorded after each cycle of illumination. The intensities of 335, 435 and 620 nm bands were obtained after numerical deconvolution of the optical absorption spectra. The results are presented in FIG. 14 and demonstrate that by using high peak power density red laser illumination one can erase the 335 nm and 630 nm bands and restore 435 nm band converting this way the medium into it original unwritten state.

EXAMPLE VIII

FIGS. 15 and 16 illustrate the possibility of multilevel data storage utilizing the $Al_2O_3$:C,Mg optical storage medium. The multilevel recording is based on the inverse proportionality between the fluorescent intensity of the written bits and the number of writing pulses. Ten bits were written in the $Al_2O_3$:C,Mg crystal with incremental number of "writing" laser pulses. Modulation depth of the produced bits is a nonlinear function of the number of laser pulses but nevertheless can be digitized onto several data values and even further increase the density of data storage utilizing the method and the medium of the present invention.

EXAMPLE IX

The optical properties of $Al_2O_3$:C,Mg crystals utilized in the tests of the present invention now will be described. $Al_2O_3$:C,Mg crystals in the shape of a boule having a 45 mm diameter were obtained. Crystals were then cut in to 1.8 mm thick disks and polished on both sides to obtain optical quality surfaces. Optical absorption spectra of the $Al_2O_3$:C, Mg crystalline material utilized in the present invention and of a known $Al_2O_3$:C crystal were obtained using Shimadzu UV-2104PC spectrophotometer and are shown in FIG. 2. The intensity of $F^+$-bands at 230 and 255 nm is significantly higher in Mg-doped crystals. That indicates higher concentration of $F^+$-centers, charge compensated by the $Mg^{2+}$-ions. A blue absorption band at 435 nm indicates the creation of aggregate $F_2^{2+}$(2Mg) defects used in the present invention. The grown crystal had 30 $cm^{-1}$ of absorption in the F-center band at 205 nm and an absorption coefficient of 10 $cm^{-1}$ in the $F^+$-centers absorption band at 255 nm and 1.2 $cm^{-1}$ of absorption at 435 nm corresponding to absorption of $F_2^{2+}$(Mg)-center (see FIGS. 2 and 3). All absorption coefficients are presented after subtraction of the background pedestal. According to Smacula's formula, an absorption coefficient may be converted into a concentration of F-centers equal to $8.6 \cdot 10^{17}$ $cm^{-3}$ and concentration of $F^+$-centers equal to $2.6 \cdot 10^{17}$ $cm^{-3}$ and $1.7 \cdot 10^{16}$ $cm^{-3}$ of $F_2^{2+}$(Mg)-centers. The later number indicates that there are 17,000 fluorescent centers per cubic micron of a storage medium.

EXAMPLE X

Figure 7:
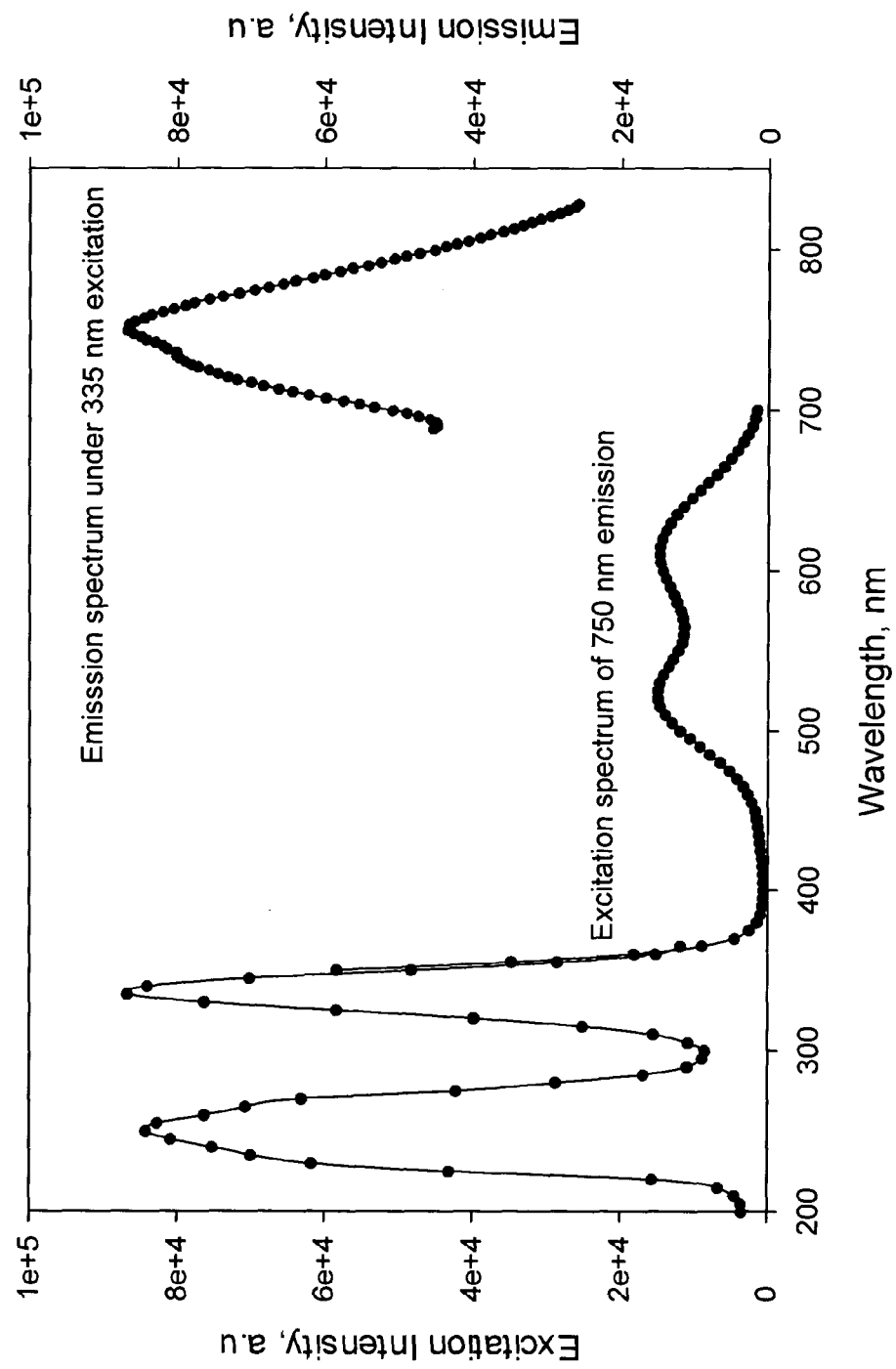
FIG. 7 is a graph showing the excitation and emission spectra of $F_2^+(2Mg)$-centers obtained as a result of photo-conversion of an $F_2^{2+}$(2Mg)-center ("write" operation) in $Al_2O_3$:C,Mg crystals using pulsed blue laser light with a wavelength of 430 nm.
Figure 8:
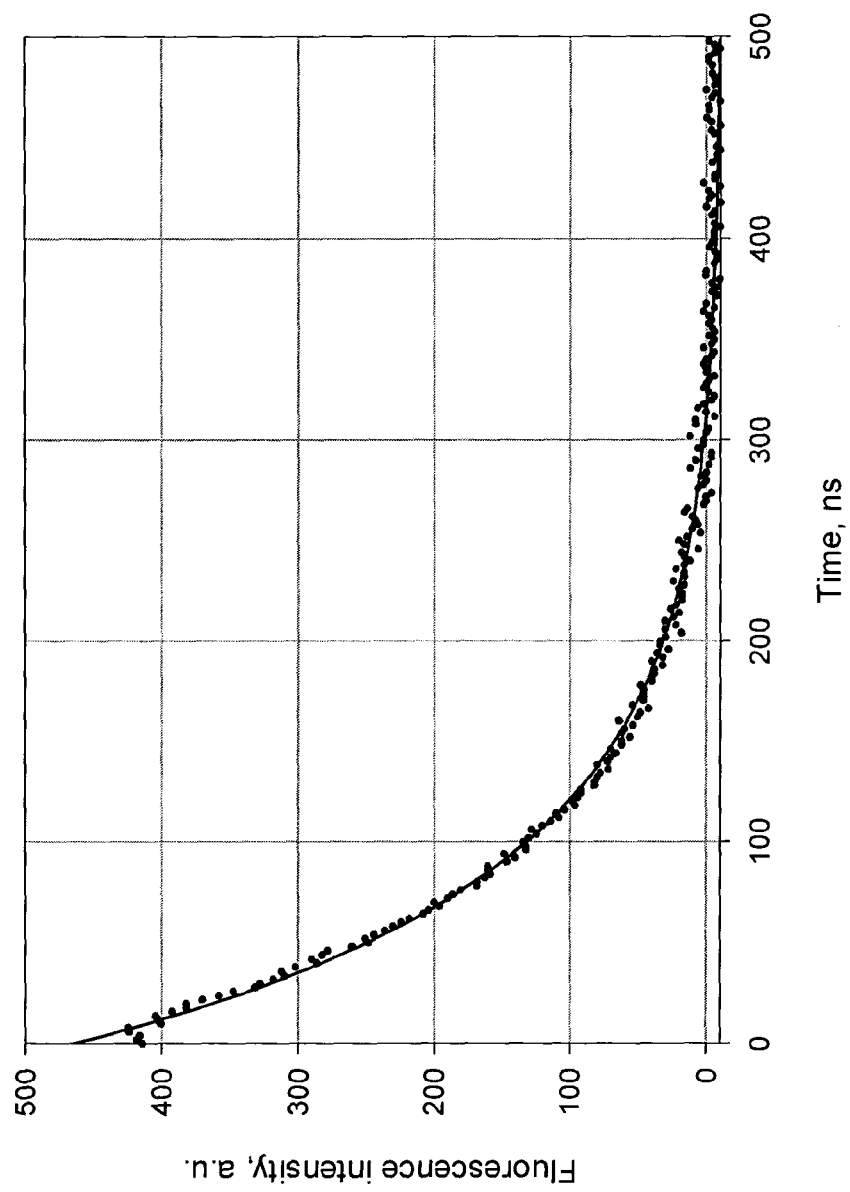
FIG. 8 is a graph showing the lifetime measurement of $F_2^+$(2Mg)-center emission at 750 nm equal to 80±5 ns for an $Al_2O_3$:C,Mg luminescent material according to a preferred embodiment of the present invention.

To justify the appropriate wavelength range for the "write", "read" and "erase" operations according to the present invention, the emission-excitation spectra of aggregate centers in $Al_2O_3$ doped with Mg and C in two different states were obtained (FIG. 4 and FIG. 7). The spectra were obtained using a spectrofluorimeter equipped with the pulsed EG&G Xe-lamp, two scanning Acton Research spectrographs and a cooled CCD from Princeton Instruments. It was shown that a fresh (or erased) crystal shows an intense green luminescence band in the region of 520 nm with the excitation band corresponding to the blue absorption band at 435 nm (FIGS. 2 and 3). After a writing operation with 430 nm pulsed laser, the blue 435 nm absorption band (see FIG. 3) and the corresponding 520 nm green emission band disappears almost completely and the crystal shows an intensive emission band in the region of 750 nm with excitation bands at 260 nm, 335 nm and 620 m (FIG. 7), all of which are assigned to $F_2^+$(2Mg)-centers. Both emission bands: green band at 520 and near IR band at 750 nm corresponding to $F_2^{2+}$(2Mg)- and $F_2^+$(2Mg)-centers have a short lifetime of about 9 and 80 ns respectively (see FIGS. 5 and 8).

EXAMPLE XI

Photo-induced transformation of color centers in $Al_2O_3$: C,Mg utilized for recording and erasing the data was demonstrated. Exposure of an $Al_2O_3$:C,Mg crystal having oxygen vacancy defects to high intensity laser light of appropriate wavelength results in photo-induced conversion of the same structural defect from one charged state into another. For example, $F_2^{2+}$(2Mg)-centers are converted into $F_2^+$(2Mg)-centers with 430 nm illumination (FIGS. 3 and 6) and may be converted back with 335 nm pulsed laser light. After photochromic transition induced by blue laser light, $Al_2O_3$:C,Mg crystals exhibit an absorption/excitation bands at 335 nm and 620 nm (FIGS. 3, 6 and 7), and a corresponding broad fluorescent emission at 750 nm (FIG. 7).

EXAMPLE XII

The evidence of preferred two-photon absorption in aggregate oxygen vacancy defects is provided by quadratic dependence of the photo-ionization cross-section of these centers versus laser light intensity (see FIG. 9). The test was performed with 415 nm, 4.5 ns laser pulses of an optical parametric oscillator illuminating a thin, 380 μm, $Al_2O_3$:C, Mg crystal and recording the decay constant of fluorescence as a function of laser energy density. The photo-ionization cross-section was than calculated as inversely proportional to this decay constant.

Wavelength dependence of a photo-ionization cross-section of $F_2^{2+}$(2Mg) centers was measured as a function of wavelength. The peak position of a photo-ionization cross-section is shifted to a shorter wavelength in comparison with the one-photon absorption/excitation band (FIGS. 4 and 10) and is another indication of the 2PA process in $Al_2O_3$:C,Mg crystals.

EXAMPLE XIII

Possible data transfer rate and nondestructive readout operation according to the present invention was tested. Reading of the written areas using Type 1 (or so-called "negative" operation) was performed with the blue laser diode from PicoQuant (0.6 mW of average power, 60 ps pulses, and the repetition rate of 20 MHz). Fluorescence at 520 nm was detected using a long pass glass filter OG515, high-speed ThorLabs DET210 silicon photo-detector and Tektonix TDS-3054 oscilloscope. A fluorescent signal with decay time of 9 ns is presented in FIG. 5 and indicates the possibility to achieve a data transfer rate of up to 100 Mbit/s. The fluorescent signal of unwritten area of the crystal show intensive 520 nm fluorescence. The amplitude of this pulsed signal did not show any decrease for several hours indicating that there is only one-photon absorption during "read" operation. For comparison, area of the crystal subjected to "writing" pulsed 435 nm laser light shows fluorescent signal equal to only 10% of the signal from unwritten crystal.

EXAMPLE XIV

Readout operation utilizing a Type 2 or "positive" fluorescent process was tested. The "write" operation was performed using the same crystal sample as described in Example II and the Continuum Panther OPO laser system described in Example VII. Reading of the written areas using Type 2 (or "positive" type of operation) was performed with the 335 nm UV beam from the same OPO laser system (100 nJ/pulse, 4.5 ns pulse duration and 10 Hz repetition rate). Fluorescence at 750 nm was detected using a long pass glass filter RG610 and a silicon photodiode DET-110 from ThorLabs, Inc. and Tektonix TDS-3054 oscilloscope. A fluorescent signal with decay time of 80±10 ns is presented in FIG. 8. An infrared fluorescence band at 750 nm of a bleached (written) crystal has a longer lifetime than 520 nm green fluorescence of an erased crystal medium but it is still fast enough for the data transfer rate operation of up to 10 Mb/s.

EXAMPLE XV

Figure 6:
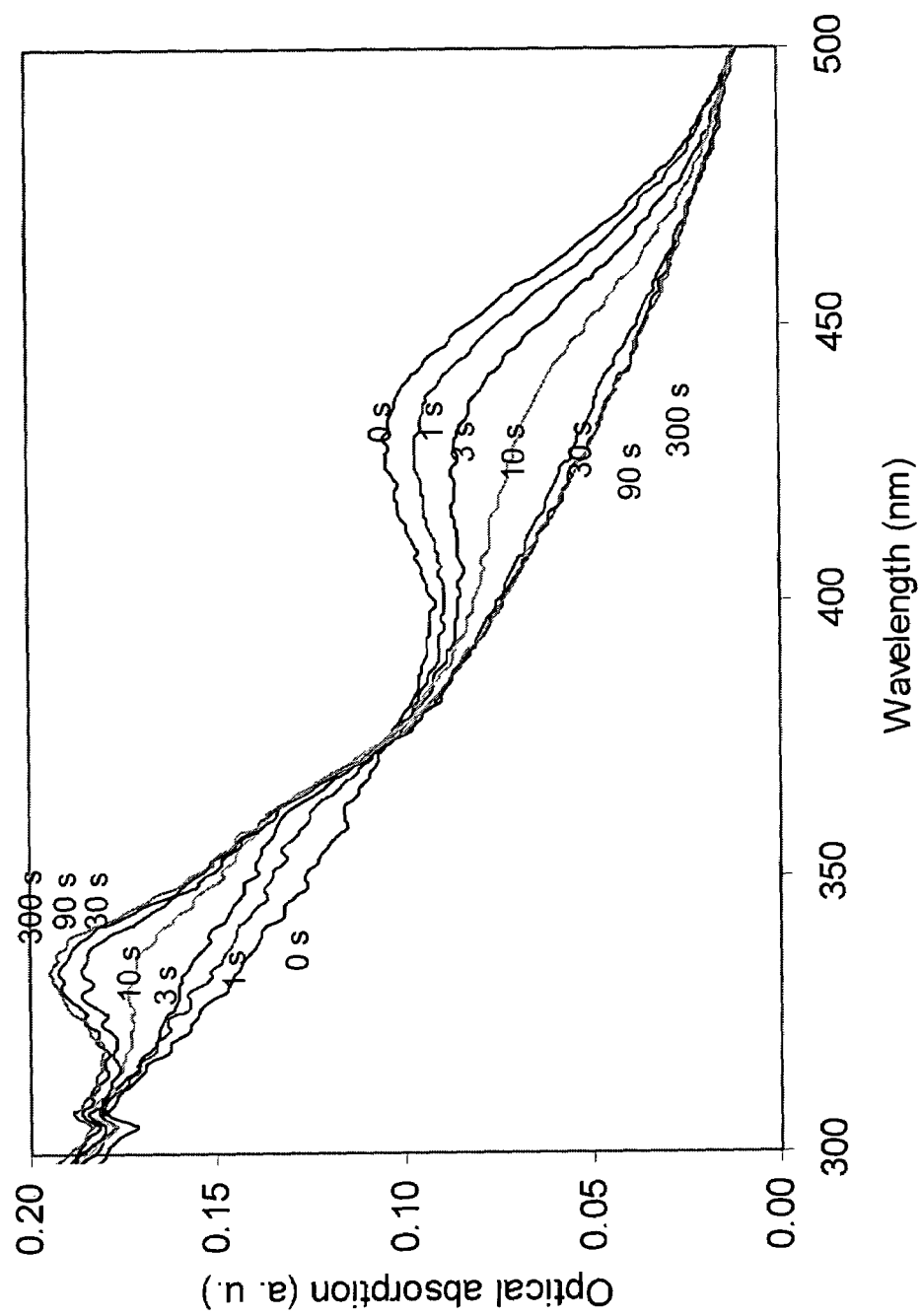
FIG. 6 is a graph illustrating the multilevel data storage principle based on the inverse proportionality between 435 and 335 nm absorption band intensities and their dependence on the "write" time for a $Al_2O_3$:C,Mg luminescent material of a preferred embodiment of the present invention.

FIG. 6 can be used as another illustration of multilevel data storage capabilities of the utilized optical storage method based on the inverse proportionality between 435 and 335 nm absorption band intensities and their dependence of writing time. The $Al_2O_3$:C,Mg crystal described in the Example II was subjected to an incremental number of 430 nm "writing" laser pulses of the OPO laser system described in Example VII. Each second of illumination corresponds to 10 laser pulses. Absorption at a 435 nm band associated with the 520 nm fluorescent signal reduces as a function of number of writing laser pulses whereas the absorption of a 335 nm band associated with $F_2^+(2Mg)$ and infrared luminescence at 750 nm increases at the same time.

EXAMPLE XVI

A very important feature of photochromic transformations in $Al_2O_3$:C,Mg crystals is their high thermal stability. This high thermal and optical stability of recorded information is attributed to deep traps created during crystal growth and is demonstrated by a step-annealing test of optical absorption bands in $Al_2O_3$:C,Mg crystal (FIG. 11). During recording with high intensity blue laser light, 430 nm bands convert into 335 nm and 620 nm bands $[2F_2^{2+}(2Mg) + 2h\nu \rightarrow F_2^+(2Mg) + F_2^{3+}(2Mg)]$. Reverse transformation of optical absorption bands $[F_2^+(2Mg) + F_2^{3+}(2Mg) \rightarrow F_2^{2+}(2Mg)]$ takes place at about 650° C.

EXAMPLE XVII

The reverse photochromic transformation and restoration of the 435 nm absorption band was achieved by either pulsed 335±20 nm illumination or more efficient by sequential illumination of the crystal with 215 nm and than with 335 nm laser light corresponding to absorption of F and $F_2^+$ (2Mg) centers. An original strong absorption at 435 nm and fluorescence at 520 nm was restored. The inverse photochromic process that converts $F_2^+$(Mg)-centers into $F_2^{2+}$(Mg)-centers can be performed by two-photon absorption of laser light within 335 nm absorption band. Complete erasure of recorded data and restoration of original green coloration of $Al_2O_3$:C,Mg can be achieved by heating the crystal to 650° C. (FIG. 11).

All documents, patents, journal articles and other materials cited in the present application are hereby incorporated by reference.

It is important to emphasize that the invention is not limited in its application to the detail of the particular material and technological steps illustrated herein. The invention is capable of other embodiments and of being practiced or carried out in a variety of ways. It is to be understood that the phraseology and terminology employed herein is for the purpose of description and not of limitation.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. A method of reading information stored on a data storage medium comprising the steps of:

(a) exciting a luminescent data storage medium with an optical source to thereby cause said luminescent data storage medium to emit a fluorescent light signal, wherein said luminescent data storage medium comprises $Al_2O_3$ and wherein said optical source emits a read laser beam having a wavelength in the range of an absorption band of said luminescent data storage medium; and (b) measuring said laser induced fluorescence light signal from said luminescent data storage medium, to thereby read said information stored on said luminescent data storage medium, wherein said luminescent data storage medium comprises:

a base material comprising $Al_2O_3$;

a first dopant comprising magnesium; and a second dopant comprising carbon, wherein said luminescent data storage medium includes a plurality of at least one type of oxygen vacancy defect, and wherein said luminescent data storage medium includes at least one color center having: an absorption bands in the regions of 250±5 nm, 335±5 nm and 620±10 nm, an emission in the region of 750±10 nm, and a 80±10 ns lifetime.

2. The method of claim 1, wherein step (a) comprises exciting said luminescent data storage medium using a one-photon absorption technique without causing photo-ionization of the storage centers to thereby cause said luminescent data storage medium to emit a fluorescent light signal and thereby read said luminescent data storage medium non-destructively.

3. The method of claim 1, wherein step (a) comprises exciting said luminescent data storage medium using a simultaneous two-photon absorption technique without causing photo-ionization of the storage centers to thereby cause said luminescent data storage medium to emit a fluorescent light signal and thereby read said luminescent data storage medium non-destructively.

4. The method of claim 3, wherein said data storage medium is excited by light from said optical source having a wavelength about two times longer than the wavelength of the absorption band of said luminescent data storage medium.

5. The method of claim 1, wherein said read laser beam has a wavelength within an absorption band of $Al_2O_3$:C,Mg centered at 620±10 nm and wherein said fluorescent light signal has an emission band having a wavelength range of 620–880 nm, inclusive, and being centered at 750±10 nm.

6. The method of claim 1, wherein said fluorescent light signal is excited using light of the wavelength within an absorption band of $Al_2O_3$:C,Mg and centered at 250±10 nm and wherein said fluorescent light signal has an emission band having a wavelength range of 620 nm to 880 nm, inclusive, and being centered at 750±10 nm.

7. The method of claim 1, wherein said luminescent data storage medium includes at least one color center having: an absorption in the region of 435±5 nm, an emission in the region of 520±5 nm and a 9±3 ns fluorescence lifetime and at least one color center having: absorption bands in the regions of 335±5 nm and 620±10 nm, an emission in the region of 750±5 nm, and a 80±10 ns lifetime.

8. The method of claim 1, wherein said fluorescent light signal has a wavelength of 650 and 800 nm, inclusive, and centered at 750±10 nm.

9. The method of claim 1, wherein said read laser beam illuminates said luminescent data storage medium for the period of time between 1 ns and 10 μs.

10. The method of claim 1, wherein said read laser beam illuminates said luminescent data storage medium for about 100 ns.

11. The method of claim 1, wherein prior to step (a) said method further comprises the step of:
writing to said luminescent data storage medium with a write laser beam.

12. The method of claim 11, wherein said read and write laser beams are each focused through a lens and said lens is used for writing information to and reading information from said luminescent data storage medium.

13. The method of claim 1, wherein information from said luminescent data storage medium is read from more than one layer at the different depths inside said luminescent data storage medium.

14. The method of claim 1, wherein step (b) comprises detecting said fluorescence signal using a confocal detection technique.

15. The method of claim 1, wherein said read laser beam is emitted by said optical source disposed in a read/write head and said optical read/write head incorporates spherical aberration compensation allowing for a diffraction limited spot at a depth of at least 10 microns.

16. The method of claim 1, further comprising the step of:
moving said luminescent data storage medium with respect to said optical source and to a read position prior to said read laser beam exciting said luminescent data storage medium.

17. The method of claim 1, further comprising the step of:
focusing said read laser beam to a predetermined depth in said luminescent data storage medium.

18. The method of claim 17, wherein said read laser beam is focused by moving said luminescent data storage medium with respect to said read laser beam.

19. The method of claim 17, wherein said read laser beam is focused by adjusting the position of an optical pick-up head.

20. The method of claim 1, wherein said luminescent data storage medium is read for a read time equal to a read laser beam pulse length and wherein said luminescent data storage medium is a stationary data storage medium.

21. The method of claim 1, wherein said luminescent data storage medium is read for a read time equal to a ratio of a reading spot size with respect to the velocity of said luminescent data storage medium and wherein said luminescent data storage medium is a moving data storage medium.

22. A method of writing information to a data storage medium comprising the steps of:
providing a luminescent data storage medium comprising $Al_2O_3$; and
writing said information to said luminescent data storage medium with an optical source, wherein said luminescent data storage medium has an orientation of the optical c-axis parallel to the direction of the light propagation of said optical source.

23. The method of claim 22, wherein said luminescent data storage medium comprises:
a base material comprising $Al_2O_3$;
a first dopant comprising Mg; and
a second dopant comprising carbon, wherein said luminescent data storage medium includes a plurality of at least one type of oxygen vacancy defect.

24. The method of claim 23, wherein said luminescent data storage medium includes at least one color center having: an absorption in the region of 435±5 nm, an emission in the region of 520±5 nm and a 9±3 ns fluorescence lifetime.

25. The method of claim 23, wherein said luminescent data storage medium includes at least one color center having: an excitation and absorption bands in the regions of 250±5 nm, 335±5 nm and 620±10 nm, an emission in the region of 750±10 nm and a 80±10 ns fluorescence lifetime.

26. The method of claim 23, wherein said laser beam has a wavelength of 370 to 490 nm, inclusive.

27. The method of claim 23, wherein said optical source emits a laser beam having a wavelength of 390 nm.

28. A method of writing information to a data storage medium comprising the steps of:
providing a luminescent data storage medium comprising $Al_2O_3$; and
writing said information to said luminescent data storage medium with an optical source, wherein said luminescent data storage medium has an orientation of the optical c-axis perpendicular to the direction of the light propagation of said optical source and wherein the vector of polarization of said optical source rotates synchronously with the rotation of said luminescent data storage medium, and maintains the optical c-axis of the crystal parallel to the polarization direction of the optical source.

29. A method of reading information stored on a data storage medium comprising the steps of:
(a) exciting a luminescent data storage medium with an optical source to thereby cause said luminescent data storage medium to emit a fluorescent light signal, wherein said luminescent data storage medium comprises $Al_2O_3$ and wherein said optical source emits a read laser beam having a wavelength in the range of an absorption band of said luminescent data storage medium; and wherein said luminescent data storage medium has an orientation of the optical c-axis parallel to the direction of the light propagation of said optical source; and
(b) measuring said laser induced fluorescence light signal from said luminescent data storage medium, to thereby read said information stored on said luminescent data storage medium.

30. A method of reading information stored on a data storage medium comprising the steps of:
(a) exciting a luminescent data storage medium with an optical source to thereby cause said luminescent data storage medium to emit a fluorescent light signal, wherein said luminescent data storage medium comprises $Al_2O_3$ and wherein said optical source emits a read laser beam having a wavelength in the range of an absorption band of said luminescent data storage medium; and wherein said luminescent data storage medium has an orientation of the optical c-axis perpendicular to the direction of the light propagation of said optical source and wherein the vector of polarization of said optical source rotates synchronously with the rotation of said luminescent data storage medium, and wherein said c-axis of the crystal maintains parallel to the polarization direction of the optical source; and
(b) measuring said laser induced fluorescence light signal from said luminescent data storage medium, to thereby read said information stored on said luminescent data storage medium.

31. A method of erasing information stored on a data storage medium comprising the steps of:
(a) providing a luminescent data storage medium comprising $Al_2O_3$, said luminescent data storage medium having said information stored thereon; and (b) illuminating said luminescent data storage medium with an optical source to thereby erase said information, wherein said luminescent data storage medium comprises:
a base material comprising $Al_2O_3$;
a first dopant comprising magnesium; and
a second dopant comprising carbon, wherein said luminescent data storage medium includes a plurality of at least one type of oxygen vacancy defect, and wherein said luminescent data storage medium includes at least one color center having: an absorption bands in the region of 250±5 nm, 335±5 nm and 620±10 nm, an emission in the region of 750±5 nm and a 80±10 ns lifetime.

32. The method of claim 31, wherein step (b) comprises illuminating of said luminescent data storage medium with said optical source having a wavelength at 620±50 nm in condition of multi-photon absorption.

33. The method of claim 31, wherein said luminescent data storage medium has an orientation of the optical c-axis parallel to the direction of the light propagation of said optical source.

34. The method of claim 31, wherein said luminescent data storage medium has an orientation of the optical c-axis perpendicular to the direction of the light propagation of said optical source and wherein the vector of polarization of said optical source rotates synchronously with the rotation of said luminescent data storage medium, and wherein said c-axis of the crystal maintains parallel to the polarization direction of the optical source.

35. An apparatus comprising:
a luminescent data storage medium comprising $Al_2O_3$;
an optical source for writing information to said luminescent data storage medium; and
a means for rotating said luminescent data storage medium and means for rotating of the vector of polarization of said optical source, wherein an optical c-axis of said luminescent data storage medium rotates synchronously and is parallel to the vector of polarization of said optical source.

36. An apparatus comprising:
a luminescent data storage medium comprising $Al_2O_3$;
a first optical source for exciting said luminescent data storage medium to thereby cause said luminescent data storage medium to emit a fluorescent light signal when information is stored on said luminescent data storage medium;
measuring means for measuring said emitted fluorescent light signal; and
a means for rotating said luminescent data storage medium and means for rotating of the vector of polarization of said optical source, wherein an optical c-axis of said luminescent data storage medium rotates synchronously and is parallel to the vector of polarization of said optical source.

37. The apparatus of claim 36, further comprising:
a second optical source for writing information to said luminescent data storage medium.

38. The apparatus of claim 37, wherein said first and second optical sources are the same.

39. The apparatus of claim 38, wherein said measuring means include a confocal detection means.

40. The apparatus of claim 37, further comprising an optical head including said first optical source and said second optical source.

41. An apparatus comprising:
a luminescent data storage medium comprising $Al_2O_3$; and
an optical source for erasing information from said luminescent data storage medium; and
means for rotating a vector of polarization of said optical source, wherein an optical c-axis of said luminescent data storage medium rotates synchronously and is parallel to the vector of polarization of said optical source.

* * * * *